United States Patent
Masuda

(10) Patent No.: US 6,762,110 B1
(45) Date of Patent: Jul. 13, 2004

(54) METHOD OF MANUFACTURING SEMICONDUCTOR DEVICE HAVING CAPACITOR

(75) Inventor: Yasuichi Masuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/682,897

(22) Filed: Oct. 14, 2003

(30) Foreign Application Priority Data

Mar. 25, 2003 (JP) ........................................ 2003-081969

(51) Int. Cl.[7] .............................................. H01L 21/20
(52) U.S. Cl. ...................... 438/396; 438/244; 438/253; 438/387
(58) Field of Search ................................ 438/239, 243, 438/244, 250, 253, 254, 386, 387, 393, 396, 397

(56) References Cited

U.S. PATENT DOCUMENTS

| | | | | |
|---|---|---|---|---|
| 5,940,714 A | * | 8/1999 | Lee et al. .................... | 438/396 |
| 6,187,624 B1 | * | 2/2001 | Huang ........................ | 438/253 |
| 6,255,160 B1 | * | 7/2001 | Huang ........................ | 438/239 |
| 6,292,352 B1 | | 9/2001 | Yamamichi | |
| 6,670,238 B2 | * | 12/2003 | Deboer et al. .............. | 438/255 |
| 6,677,636 B2 | * | 1/2004 | Deboer et al. .............. | 438/253 |
| 2002/0022317 A1 | | 2/2002 | Fukuzumi | |

FOREIGN PATENT DOCUMENTS

| | | |
|---|---|---|
| JP | 11-177048 | 7/1999 |
| JP | 2000-349257 | 12/2000 |
| JP | 2002-83880 | 3/2002 |

\* cited by examiner

*Primary Examiner*—Kevin M. Picardat
(74) *Attorney, Agent, or Firm*—Oblon, Spivak, McClelland, Maier & Neustadt, P.C.

(57) ABSTRACT

A method of manufacturing a semiconductor device having a capacitor is obtained that improves adhesiveness between an interlayer dielectric film and a capacitor lower electrode without providing a liner material. A bottom surface of a through hole (28) and a side surface of the lower portion thereof are defined by silicon nitride films (20) and (25). The silicon nitride film (20) is formed on a silicon oxide film (19). An upper end of a contact plug (24) protrudes from the bottom surface of the through hole (28). A tungsten film (27) is formed on a silicon oxide film (26), and a ruthenium film (30) is formed on the tungsten film (27). A portion of the silicon oxide film (26) that defines the side surface of the through hole (28) is nitrided, thereby forming a modified layer (29) in the side surface of the silicon oxide film (26). The ruthenium film (30) is directly formed on the side surface and the bottom surface of the through hole (28), so that no liner material is interposed.

15 Claims, 38 Drawing Sheets

F I G. 1
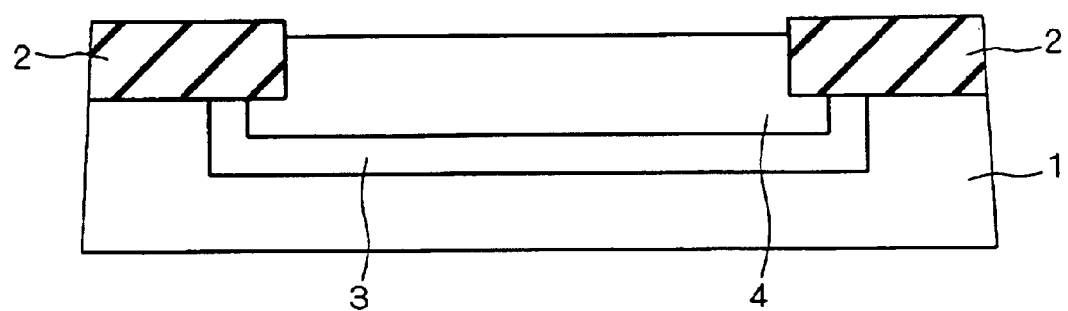
F I G. 2
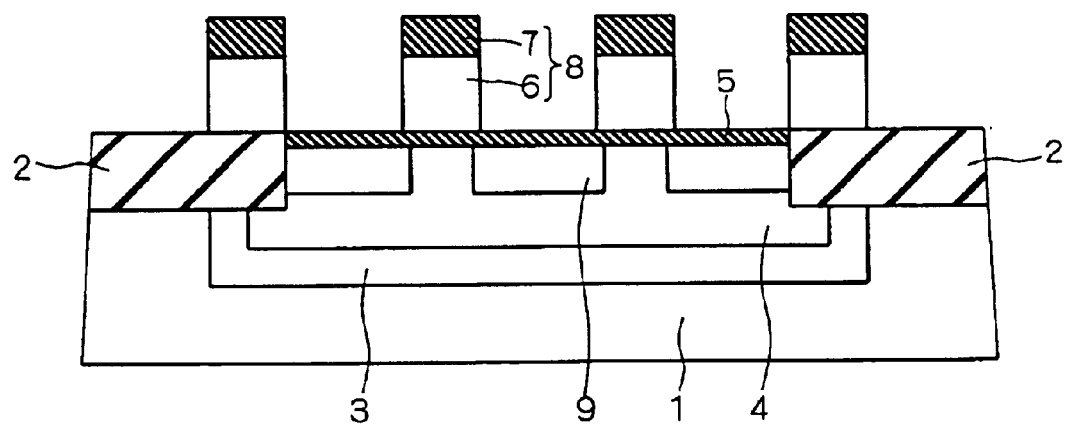

F I G. 5
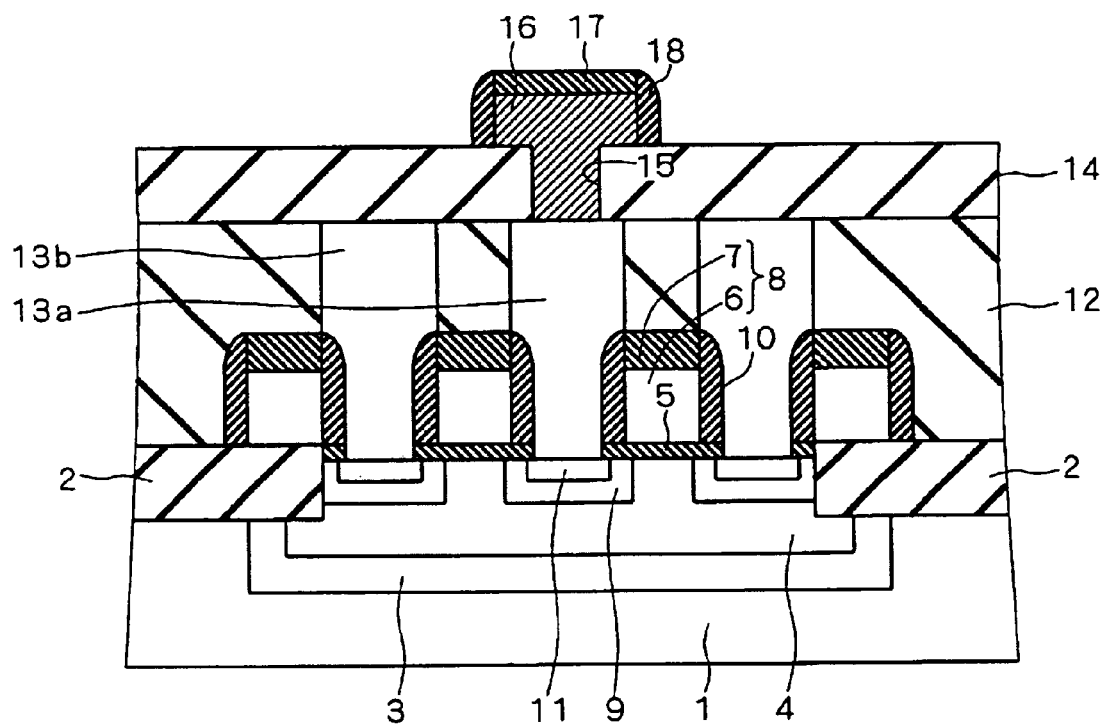

F I G. 17
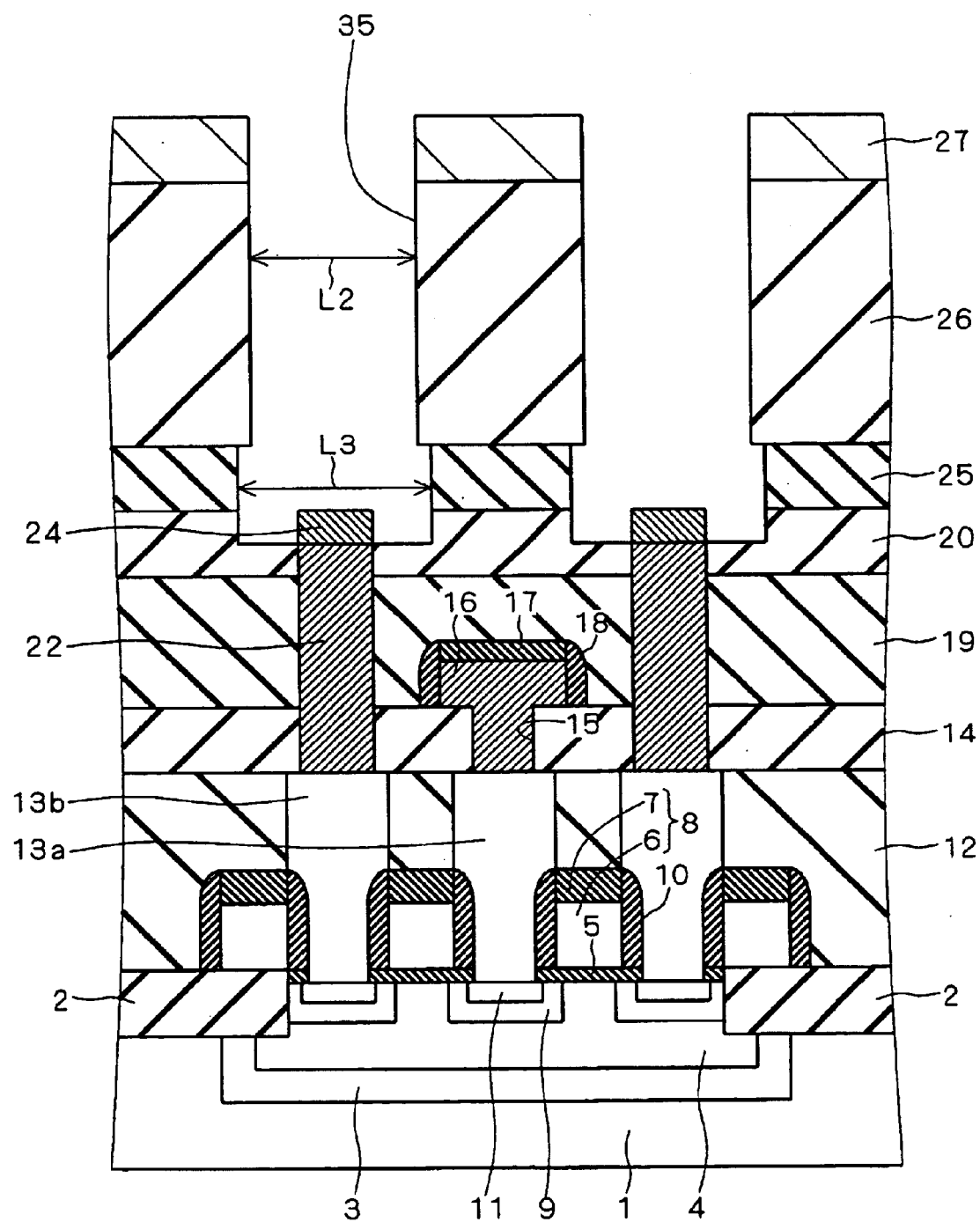

METHOD OF MANUFACTURING SEMICONDUCTOR DEVICE HAVING CAPACITOR

BACKGROUND OF THE INVENTION

1. Field of the Invention

The present invention relates to methods of manufacturing semiconductor devices having a capacitor.

2. Description of the Background Art

A conventional manufacturing method of a capacitor has the following steps: (a) forming an interlayer dielectric film on an underlying layer composed of silicon oxide, (b) forming a through hole having a bottom surface defined by the underlying layer in the interlayer dielectric film, (c) forming a liner material composed of titanium nitride on a side surface and a bottom surface of the through hole, (d) forming a capacitor lower electrode composed of ruthenium on the liner material, and (e) forming a capacitor dielectric film composed of tantalum oxide and a capacitor upper electrode composed of ruthenium on the capacitor lower electrode in this order. Provision of the liner material is to improve adhesiveness between the interlayer dielectric film and the capacitor lower electrode (see Japanese Patent Application Laid-Open No. 2002-83880, for example).

The conventional capacitor manufacturing method has the following problem, however; there is a risk that the liner material and the underlying layer are dissolved by cleaning solutions and etchant solutions that are used subsequent to the above-described step (c), and as a result, the capacitor lower electrode peels off.

SUMMARY OF THE INVENTION

It is an object of the present invention to provide a method of manufacturing a semiconductor device having a capacitor that is capable of improving adhesiveness between the interlayer dielectric film and the capacitor lower electrode without providing a liner material.

According to a first aspect of the invention, a method of manufacturing a semiconductor device having a capacitor includes the following steps (a) through (f). The step (a) is to form, on a first insulating film formed on a semiconductor substrate, a second insulating film. The step (b) is to form, in the first and second insulating films, a contact plug having an upper surface exposed in an upper surface of the second insulating film. The step (c) is to form third and fourth insulating films on a structure obtained by the step (b) in this order. The step (d) is to form a recess having a side surface and a bottom surface, the side surface defined by the third and fourth insulating films and the bottom surface defined by the upper surface of the second insulating film and the upper surface of the contact plug. The step (e) is to form a capacitor lower electrode on the side surface and the bottom surface of the recess. The step (f) is to form a capacitor upper electrode over the capacitor lower electrode so that a capacitor dielectric film is interposed therebetween. The second and third insulating films are made of a material having a higher adhesiveness to a material of which the capacitor lower electrode is made than a material of which the first and fourth insulating films are made.

Peeling-off of the capacitor lower electrode is suppressed.

According to a second aspect of the invention, a method of manufacturing a semiconductor device having a capacitor includes the following steps (a) through (g). The step (a) is to form a contact plug in a first insulating film formed on a semiconductor substrate, the contact plug having an upper surface exposed in an upper surface of the first insulating film. The step (b) is form a second insulating film on a structure obtained by the step (a). The step (c) is to partially form a predetermined film on an upper surface of the second insulating film. The step (d) is to form a recess by etching the second insulating film using the predetermined film as an etching mask, the recess having a side surface defined by the second insulating film and a bottom surface defined by the upper surface of the first insulating film and the upper surface of the contact plug. The step (e) is to form a conductive film on the side surface and the bottom surface of the recess and on the predetermined film. The step (f) is to form a capacitor lower electrode by removing the predetermined film and a portion of the conductive film that is present beyond an upper surface level of the second insulating film, the capacitor lower electrode formed of a remaining portion of the conductive film that has not removed. The step (g) is to form a capacitor upper electrode over the capacitor lower electrode so that a capacitor dielectric film is interposed therebetween. The, predetermined material is made of a material having a higher adhesiveness to a material of the capacitor lower electrode is made than a material of which the second insulating film is made.

Peeling-off of the capacitor lower electrode is suppressed.

According to a third aspect of the invention, a method of manufacturing a semiconductor device having a capacitor includes the following steps (a) through (e). The step (a) is to form a contact plug in a first insulating film formed on a semiconductor substrate, the contact plug having an upper surface exposed in an upper surface of the first insulating film. The step (b) is to form second and third insulating films on a structure obtained by the step (a) in this order. The step (c) is to form a recess by etching the second and third insulating films under a condition that an etching rate for a material of which the second insulating film is made is higher than an etching rate for a material of which the third insulating film is made, the recess having a first side surface defined by the third insulating film, a second side surface defined by the second insulating film and receding from the first side surface, and a bottom surface defined by the upper surface of the first insulating film and the upper surface of the contact plug. The step (d) is to form a capacitor lower electrode on the first side surface, the second side surface, and the bottom surface of the recess. The step (e) is to form a capacitor upper electrode over the capacitor lower electrode so that a capacitor dielectric film is interposed therebetween.

Peeling-off of the capacitor lower electrode is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 16 are cross-sectional views showing, in order of manufacturing steps, a method of manufacturing a capacitor according to a first preferred embodiment of the present invention.

FIGS. 17 through 19 are cross-sectional views showing, in order of manufacturing steps, a method of manufacturing a capacitor according to a second preferred embodiment of the present invention.

DESCRIPTION OF THE PREFERRED EMBODIMENTS

First Preferred Embodiment

Figure 3:
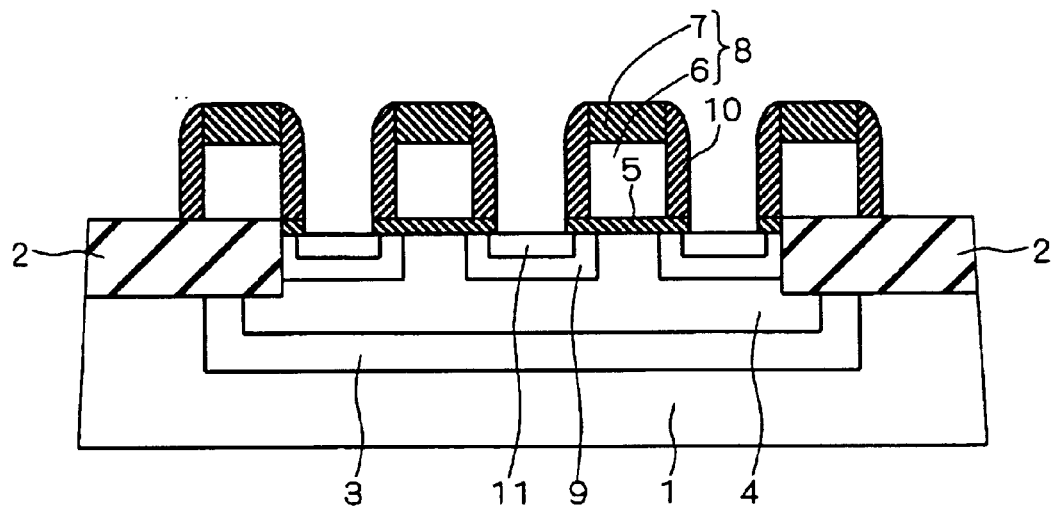

FIGS. 1 through 16 are cross-sectional views showing, in order of manufacturing steps, a method of manufacturing a capacitor according to a first preferred embodiment of the present invention. First, referring to FIG. 1, a p-type silicon substrate 1 having a resistivity of about 10 Ωcm is prepared. Next, using a known trench isolating technology, an element isolating insulation film 2 composed of silicon oxide ($SiO_2$) is partially formed in an upper surface of the p-type silicon substrate 1. The element isolating insulation film 2 defines a region in which the device element is to be formed (element forming region). Subsequently, an, impurity such as boron (B) is ion-implanted so that a p-type well 3 is formed in the upper surface of the p-type silicon substrate 1 that is in the element forming region. Then, an impurity such as phosphorus (P) is ion-implanted so that an n-type impurity-introduced region 4 is formed in an upper surface of the p-type well 3. Thereafter, in order to adjust the threshold voltage of an MOSFET, an impurity such as boron is ion-implanted in the n-type impurity-introduced region 4.

Next, referring to FIG. 2, using a thermal oxidation technique, a silicon oxide film 5 having a film thickness of about 3 to 7 nm is formed on the upper surface of the p-type silicon substrate 1. Then, gate structures 8 in each of which a gate electrode 6 and a silicon nitride film 7 are stacked in this order are partially formed on the silicon oxide film 5 and the element isolating insulation film 2. The gate electrodes 6 function as word lines. Next, pocket regions (not shown) for controlling threshold voltage are formed using an ion implantation technique. Thereafter, using the gate structures 8 as an implantation mask, an impurity such as boron is ion-implanted so that p-type impurity-introduced regions 9 are partially formed in an upper surface of the n-type impurity-introduced region 4.

In the following, formation of the gate structures 8 is discussed in detail. First, using a CVD (Chemical Vapor Deposition) technique, a polysilicon film in which an impurity such as phosphorus is doped is entirely formed so as to have a film thickness of about 50 to 70 nm. Next, with a CVD technique, a tungsten silicide (WSi) film having a film thickness of about 1 to 20 nm is entirely formed. Subsequently, using a sputtering technique, a tungsten nitride (WN) film having a film thickness of about 30 to 60 nm is entirely formed. Then, using a sputtering technique, a tungsten (W) film having a film thickness of about 50 to 100 nm is entirely formed. Subsequently, using a CVD technique, a silicon nitride film having a film thickness of about 100 to 250 nm is entirely formed. Next, these films are patterned using a photolithography technique and an anisotropic dry etching technique, thus forming the gate electrodes 6 and the silicon nitride film 7.

Next, referring to FIG. 3, using a CVD technique, a silicon nitride film ($Si_3N_4$) having a film thickness of about 150 to 300 nm is entirely formed. Then, the silicon nitride film thus formed is etched by an anisotropic dry etching technique to form sidewall spacers 10 on the side surfaces of the gate structures 8. Thus, the silicon oxide film 5 is removed from the portions that are not covered by the gate structures 8 and the sidewall spacers 10, so that portions of upper surfaces of the p-type impurity-introduced region 9 are exposed. Subsequently, using the silicon nitride film 7 and the sidewall spacer 10 as an implantation mask, an impurity such as arsenic (As) is ion-implanted so that n-type impurity-introduced regions 11 are partially formed in the upper surfaces of the p-type impurity-introduced regions 9.

Figure 4:
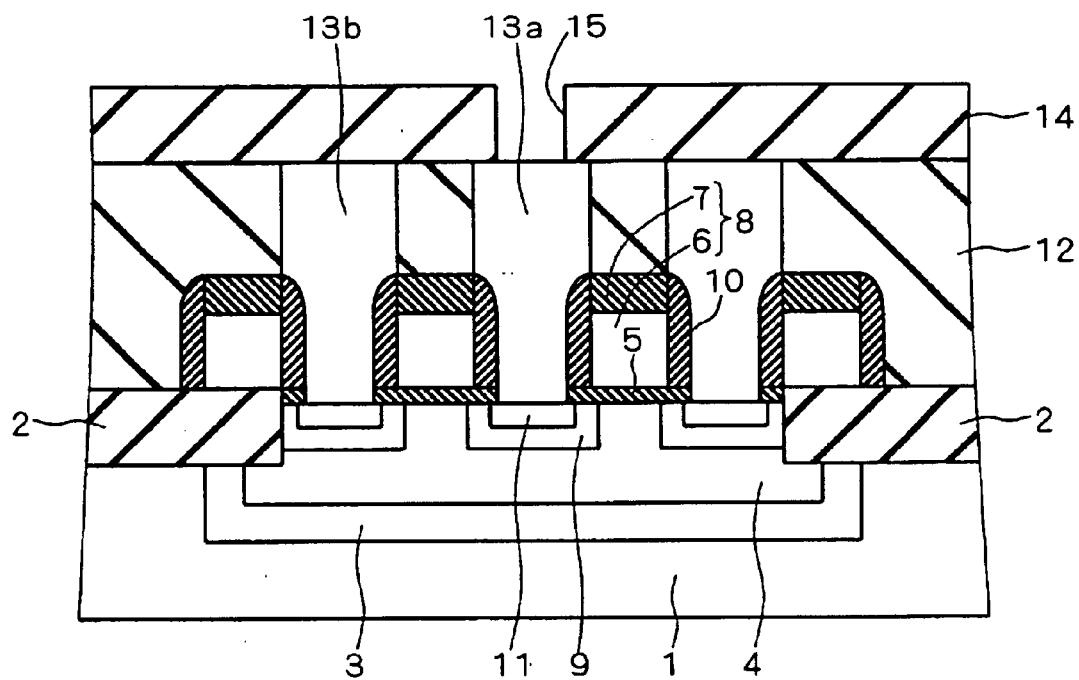

Next, referring to FIG. 4, a silicon oxide film 12 having a film thickness of about 500 nm is entirely formed using a CVD technique. Subsequently, contact plugs 13a and 13b connected to the n-type impurity-introduced regions 11 are partially formed in the silicon oxide film 12. Next, using a CVD technique, a silicon oxide film 14 having a film thickness of about 200 nm is entirely formed. Subsequently, using a photolithography technique and an anisotropic dry etching technique, a contact hole 15 having a bottom surface defined by an upper surface of the contact plug 13a is partially formed in the silicon oxide film 14.

In the following, formation of the contact plugs 13a and 13b is discussed in detail. First, contact holes each having a bottom surface defined by an upper surface of the n-type impurity-introduced region 11 are partially formed in the silicon oxide film 12 by a photolithography technique and an anisotropic dry etching technique. Next, a polysilicon film, in which an impurity such as phosphorus is doped and that has a film thickness such that it can completely fill up the contact holes, is entirely formed using a CVD technique. Thereafter, a portion of the polysilicon film that is present beyond the upper surface level of the silicon oxide film 12 is removed using a CMP (Chemical Mechanical Polishing) technique or an etch-back technique, and thus, the contact plugs 13a and 13b are formed.

Next, referring to FIG. 5, using a sputtering technique or a CVD technique, a titanium (Ti) film having a film thickness of about 10 to 50 nm and a titanium nitride (TiN) film having a film thickness of about 10 to 50 nm are entirely formed in this order. Subsequently, using a CVD technique, a tungsten film having a film thickness of about 100 to 150 nm and a silicon nitride film having a film thickness of about 50 to 200 nm are entirely formed in this order. Thereafter, these films are patterned using a photolithography technique and an anisotropic dry etching technique to form a bit line 16 and a silicon nitride film 17. The bit line 16 is connected to the contact plug 13a via the contact hole 15. Next, using a CVD technique, a silicon nitride film is entirely formed. Then, the silicon nitride film is etched using an anisotropic dry etching technique to form a sidewall spacer 18.

Figure 6:
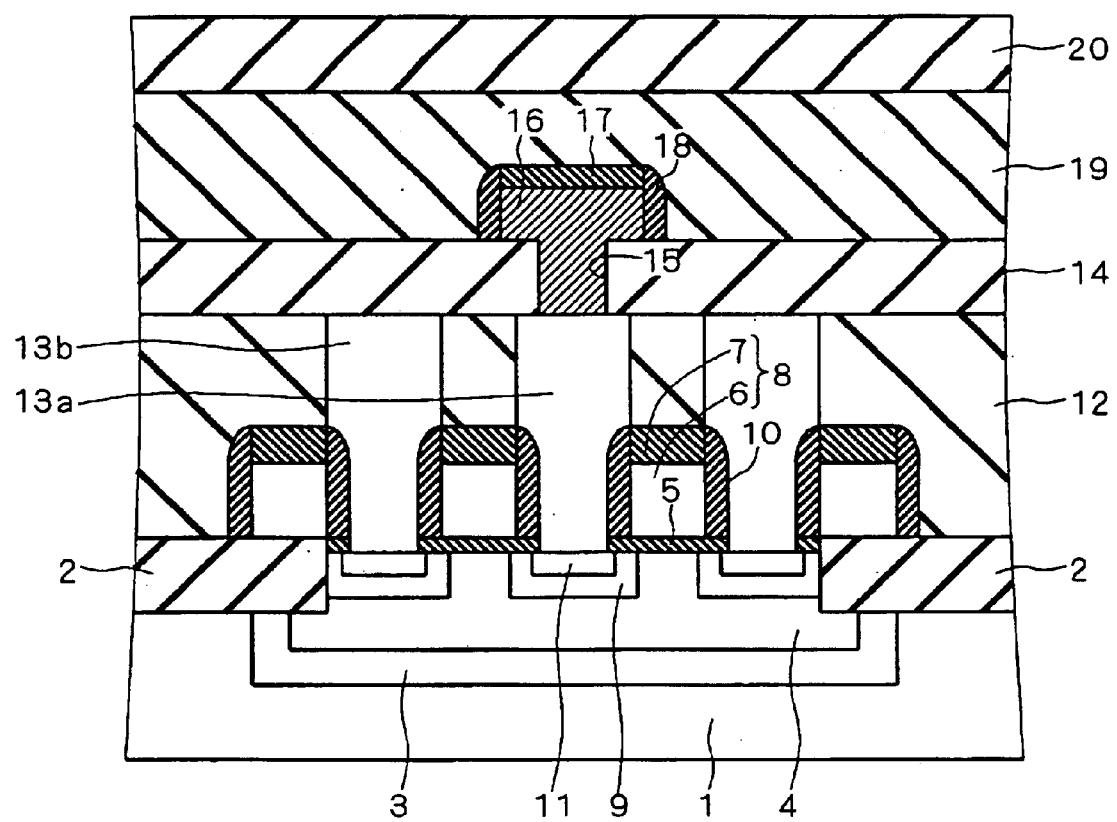

Next, referring to FIG. 6, a silicon oxide film 19 having a film thickness of about 300 to 500 nm is entirely formed on the silicon oxide film 14, the silicon nitride film 17, and the sidewall spacer 18, using a CVD technique. Subsequently, using a CVD technique, a silicon nitride film 20 having a film thickness of about 30 to 100 nm is entirely formed on the silicon oxide film 19.

Figure 7:
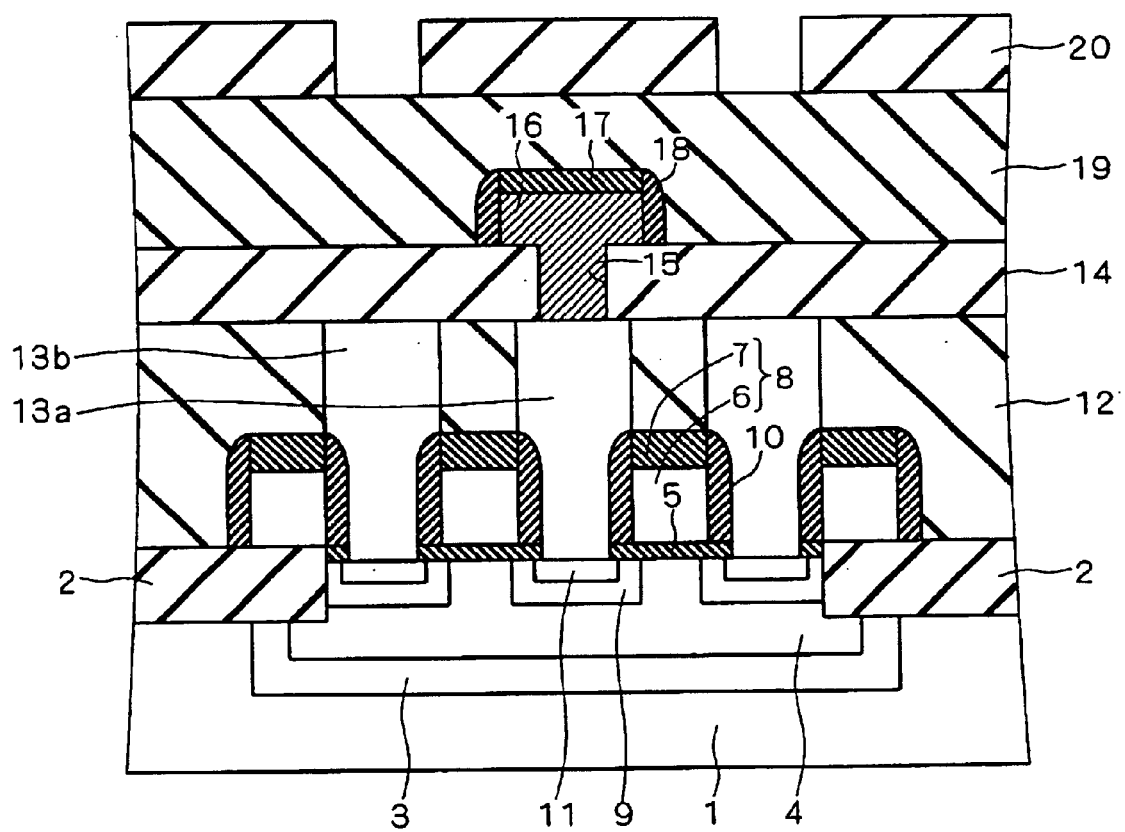

Next, referring to FIG. 7, the silicon nitride film 20 is patterned using a photolithography technique and an anisotropic dry etching technique. The silicon nitride film 20 has a pattern such that its portions thereof that are above the contact plugs 13b are opened.

Figure 8:
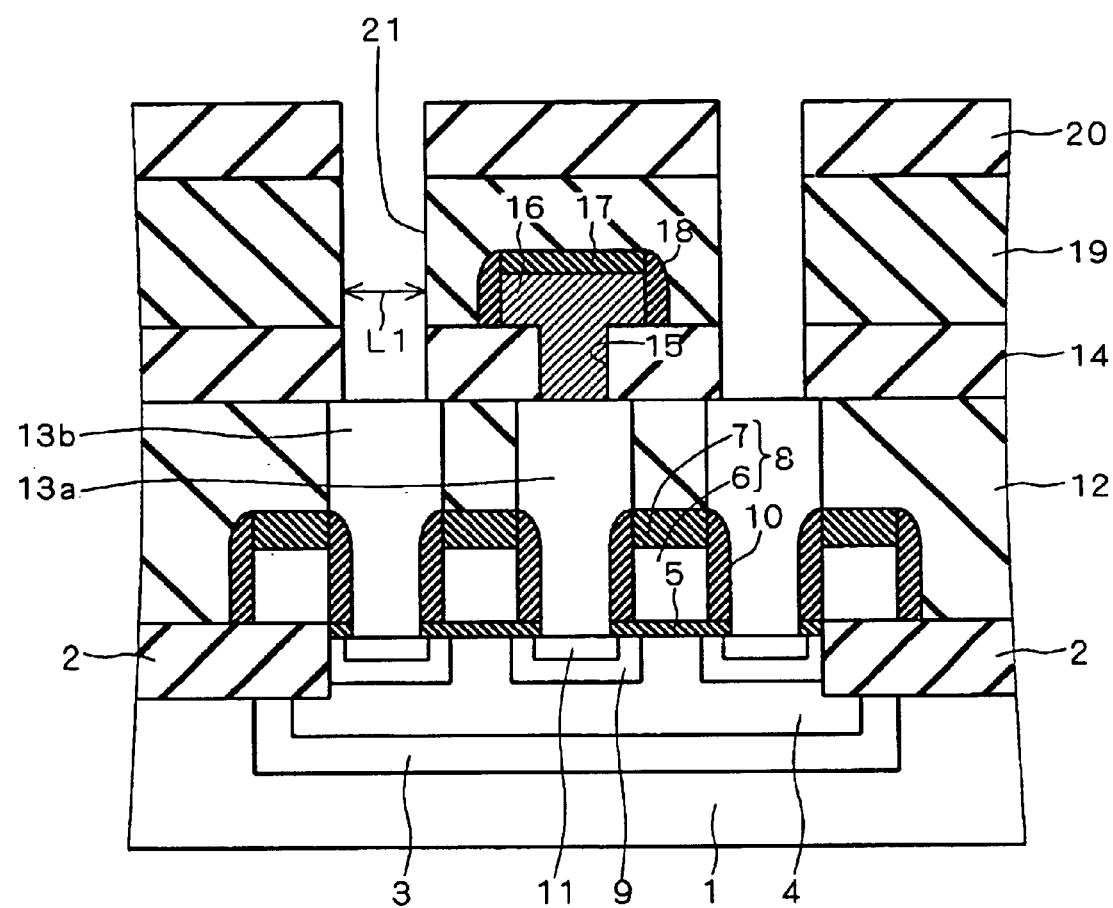

Next, referring to FIG. 8, using the silicon nitride film 20 as a hard mask, the silicon oxide films 14 and 19 are partially removed by an anisotropic dry etching technique. Thus, contact holes 21 is formed each of which has a bottom surface defined by an upper surface of the contact plugs 13b and a side surface defined by the silicon oxide films 14 and 19 and the silicon nitride film 20.

Figure 9:
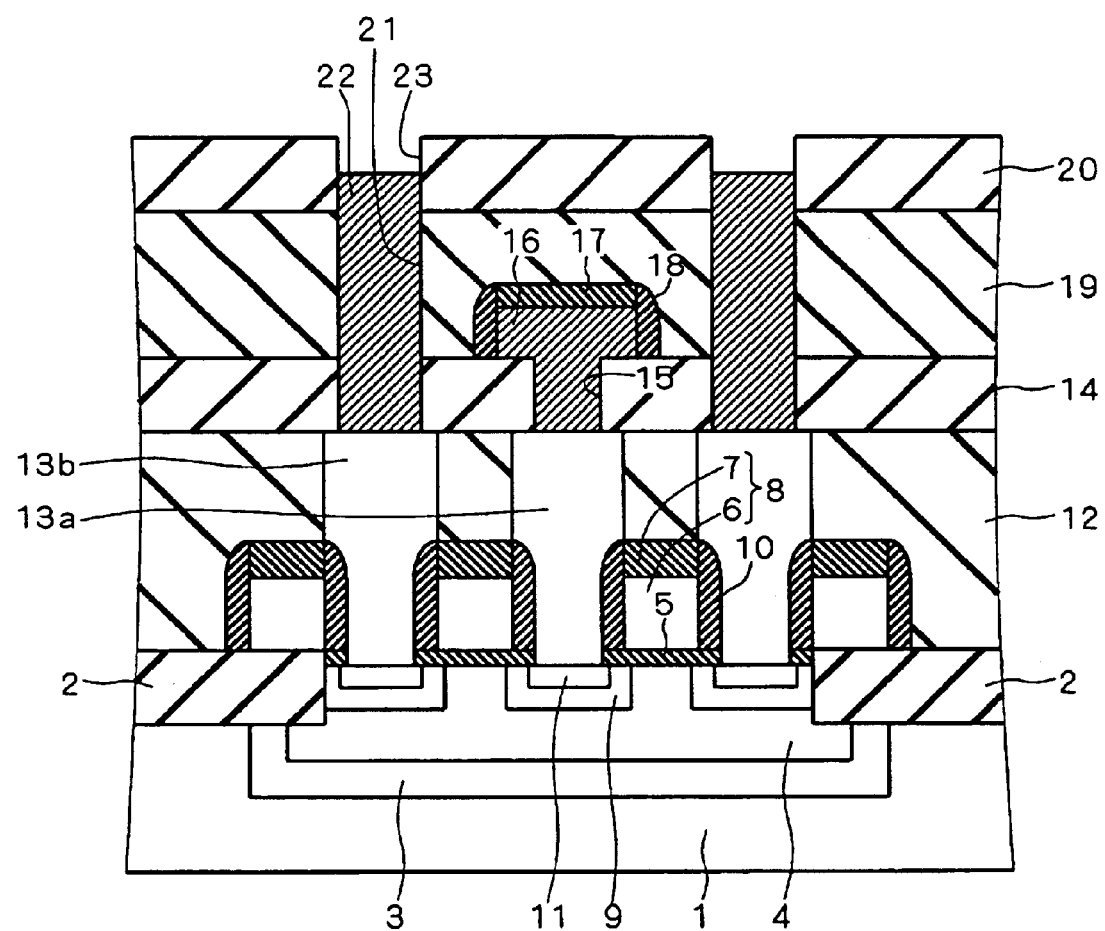

Next, referring to FIG. 9, a tungsten film having a film thickness such that it can completely fill up the contact holes 21 is entirely formed in the contact holes 21 and on the silicon nitride film 20. Here, in place of the tungsten film, it is possible to form a tungsten nitride film, a titanium nitride film, a titanium nitride silicon (TiNSi) film, a titanium nitride aluminum (TiNAl) film, a tantalum nitride (TaN) film, a tantalum nitride silicon (TaNSi) film, or a tungsten nitride silicon (WNSi) film.

Next, a portion of the tungsten film that is present beyond the upper surface level of the silicon nitride film 20 is removed using an etch-back technique. This etch back removes portions of the tungsten film that are upper portions inside the contact holes 21, forming recesses 23. With the manufacturing process thus described, contact plugs 22 connected to the contact plugs 13b are formed.

Figure 10:
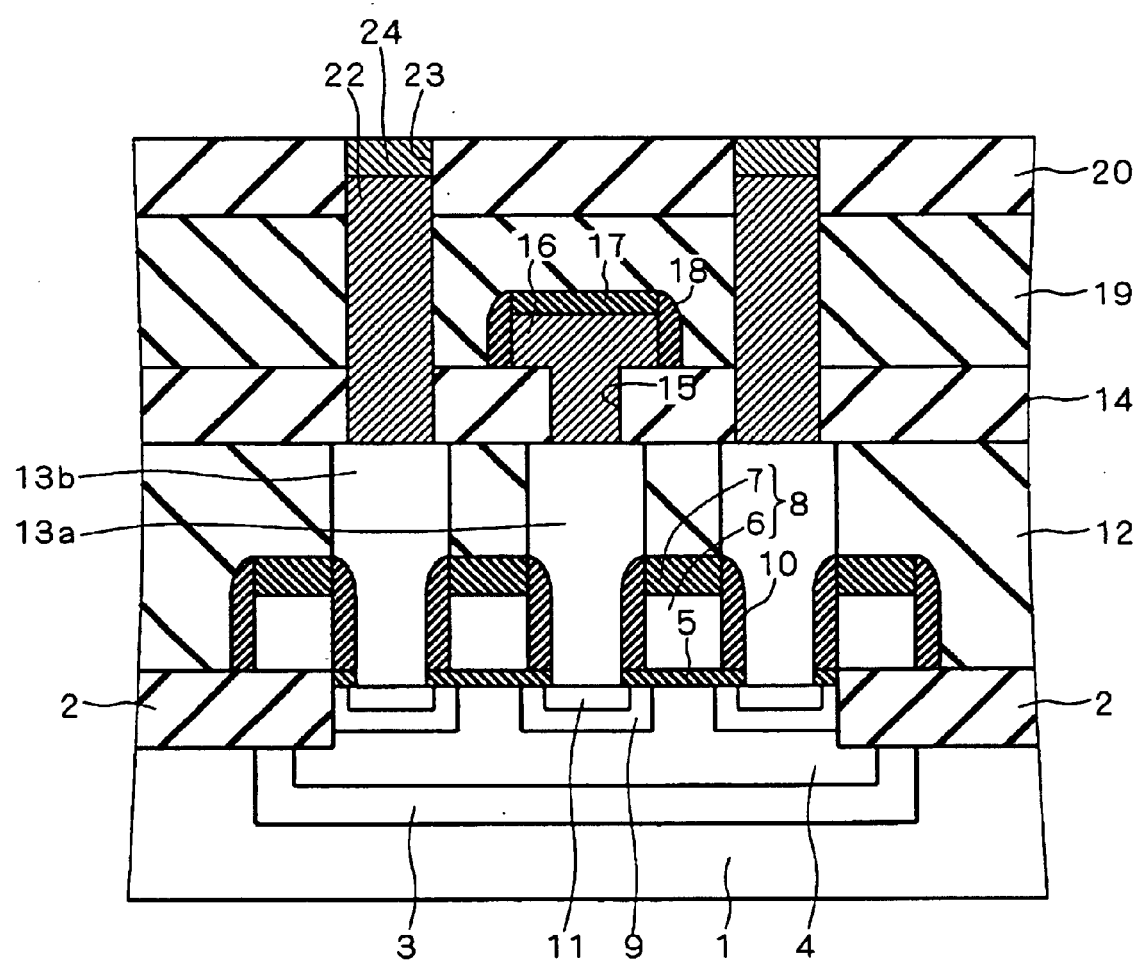

Next, referring to FIG. 10, a barrier metal film (not shown) is entirely formed on the contact plugs 22 and the silicon nitride film 20. This makes it possible to suppress undesirable reactions that are caused at the interface between a ruthenium (Ru) film that constitutes capacitor lower electrodes and the tungsten film that constitutes the contact plugs 22 at the time of a heat treatment that is performed in a later-performed step of forming a capacitor dielectric film. Then, a tantalum nitride film having a film thickness such that it can completely fill up the recesses 23 is entirely formed on the barrier metal film. Subsequently, portions of the tantalum nitride film and the barrier metal film that are present beyond the upper surface level of the silicon nitride film 20 are removed using a CMP technique or an etch-back technique. This forms contact plug 24 that fill up the recesses 23. The contact plugs 24 have an upper surface that is exposed in an upper surface of the silicon nitride film 20.

Figure 11:
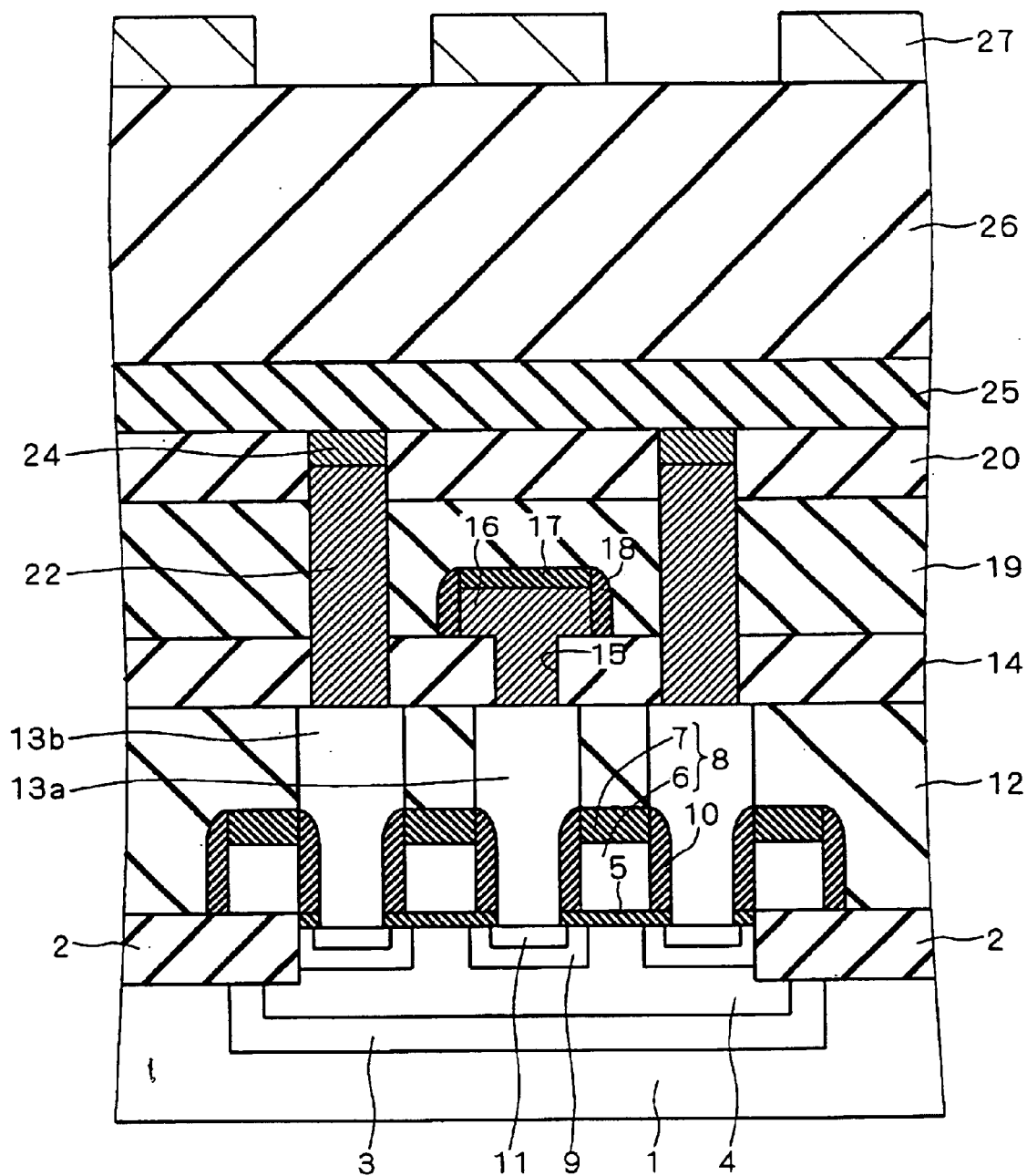

Next, referring to FIG. 11, using a CVD technique, a silicon nitride film 25 having a film thickness of about 50 to 150 nm is entirely formed on the silicon nitride film 20 and the contact plugs 24. Next, a silicon oxide film 26 having a film thickness equal to or greater than the height of the later-formed capacitor lower electrodes is entirely formed on the silicon nitride film 25. The silicon oxide film 26 is formed by, for example, a plasma CVD technique using TEOS (or BPTEOS) and $O_3$ as a source gas.

Subsequently, using a sputtering technique, a tungsten film is entirely formed on the silicon oxide film 26. Here, in place of the tungsten film, it is possible to form a tungsten nitride film, a titanium nitride film, a titanium nitride silicon film, an aluminum titanium nitride film, a tantalum nitride film, a tantalum nitride silicon film, a tungsten nitride silicon film, or a silicon nitride film. Thereafter, the tungsten film is patterned using a photolithography technique and an anisotropic dry etching technique, thus forming a tungsten film 27 having a pattern such that its portions thereof that are above the contact plugs 24 are opened.

Figure 12:
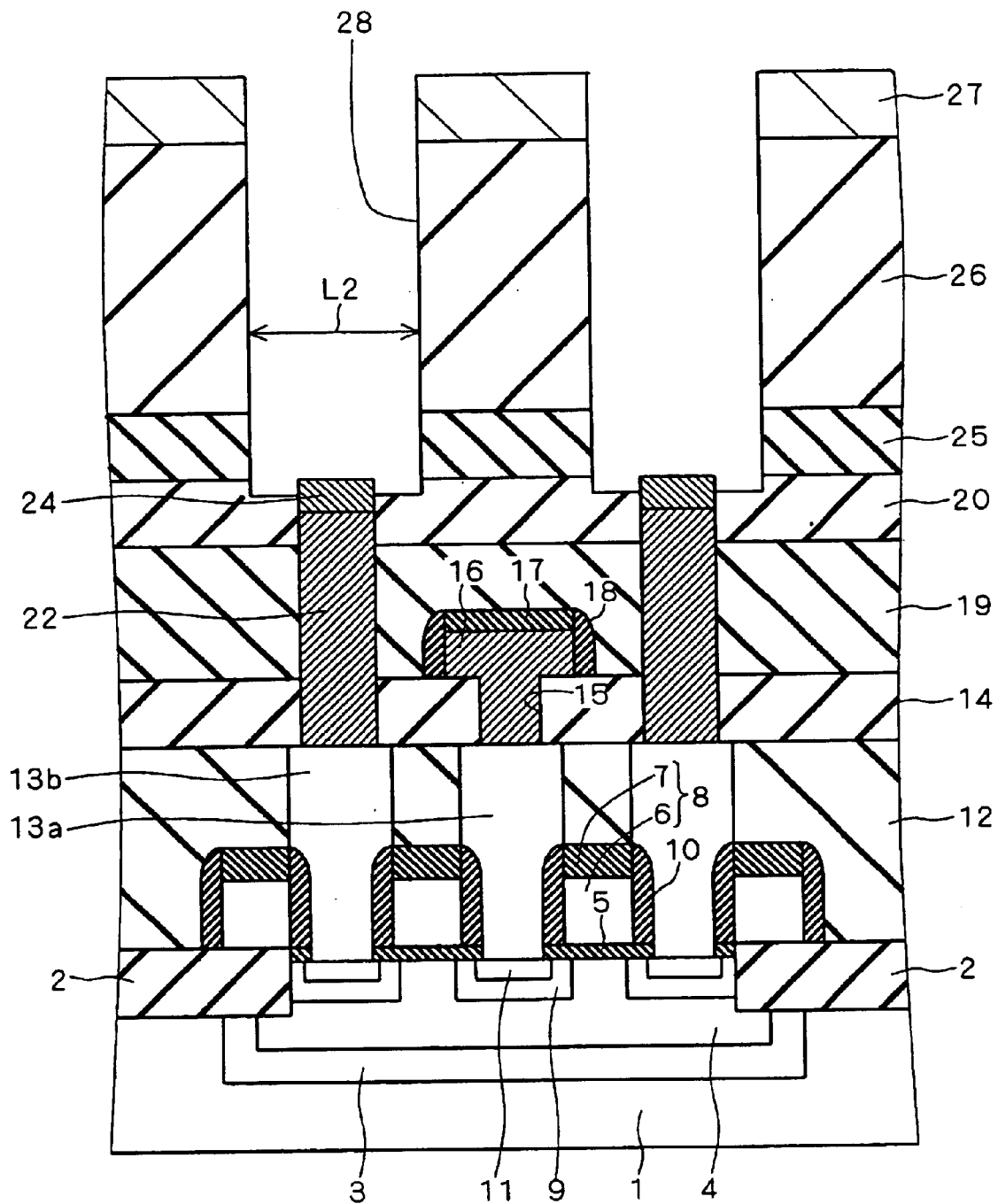

Next, referring to FIG. 12, using the tungsten film 27 as a metal hard mask, the silicon oxide film 26 and the silicon nitride films 20 and 25 are partially removed by an anisotropic dry etching technique. As a result, through holes 28 are formed, each of which has a bottom surface defined by the silicon nitride film 20 and the contact plug 24, and has a side surface defined by the silicon oxide film 26 and the silicon nitride films 20 and 25. In the first preferred embodiment, a diameter L2 of the through holes 28 is greater than a diameter L1 of the contact holes 21 shown in FIG. 8.

As shown in FIG. 12, upper ends of the contact plugs 24 protrude from bottom surfaces of the through holes 28. In addition, the etching for forming the through holes 28 does not completely remove the tungsten film 27, and in the state where the etching has been completed, the tungsten film 27 remains on the silicon oxide film 26.

Figure 13:
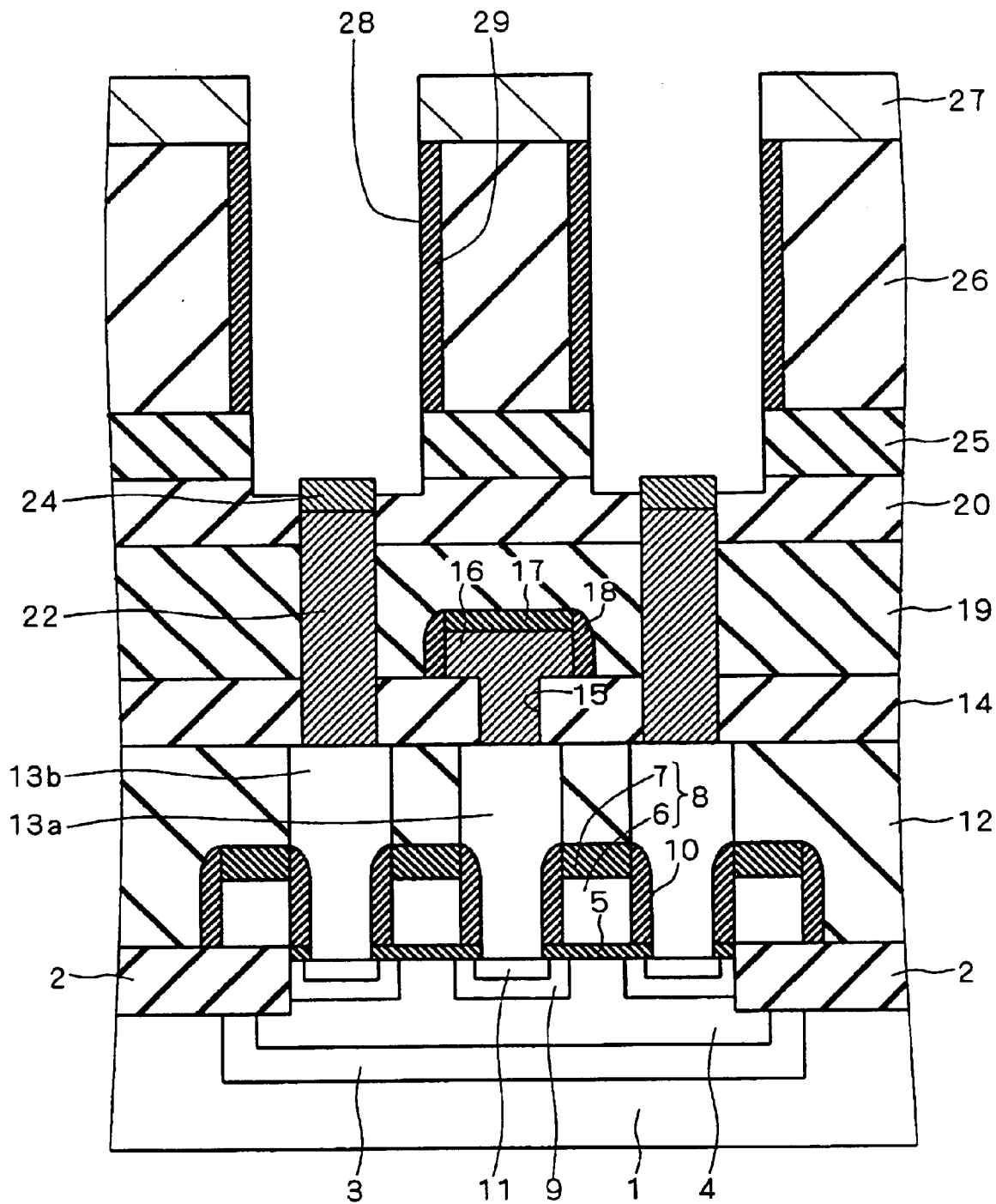

Next, referring to FIG. 13, a heat treatment at about 700° C. is performed in an ammonia ($NH_3$) atmosphere for about 1 minute. Alternatively, a heat treatment at about 650° C. is performed in a nitrogen ($N_2$) atmosphere for about 1 hour. As a result, portions of the silicon oxide film 26 that define the side surfaces of the through holes 28 are nitrided so that a modified layer 29 is formed in the side surfaces of the silicon oxide film 26.

Figure 14:
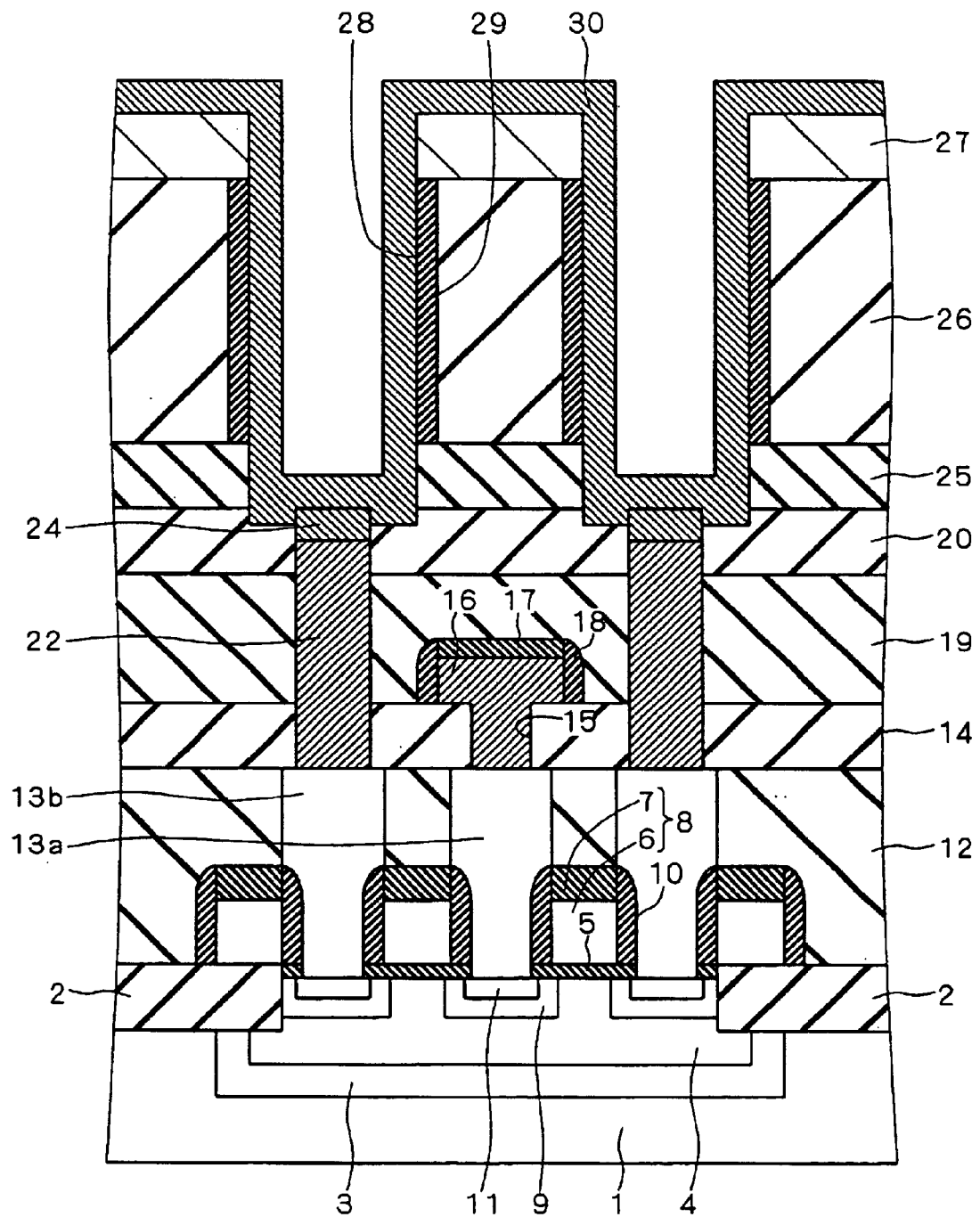

Next, referring to FIG. 14, using a sputtering technique, a seed layer of ruthenium (not shown) is formed on the side surfaces and the bottom surfaces of the through holes 28, and thereafter, using a CVD technique, a ruthenium film 30 is entirely formed. It should be noted, however, that the formation of the seed layer may be omitted. As shown in FIG. 14, the ruthenium film 30 is directly formed on the side surfaces and the bottom surfaces of the through holes 28 and on the side surfaces and the upper surface of the tungsten film 27, so that the liner material, which has been described in the description of the background art, is not interposed therebetween.

Figure 15:
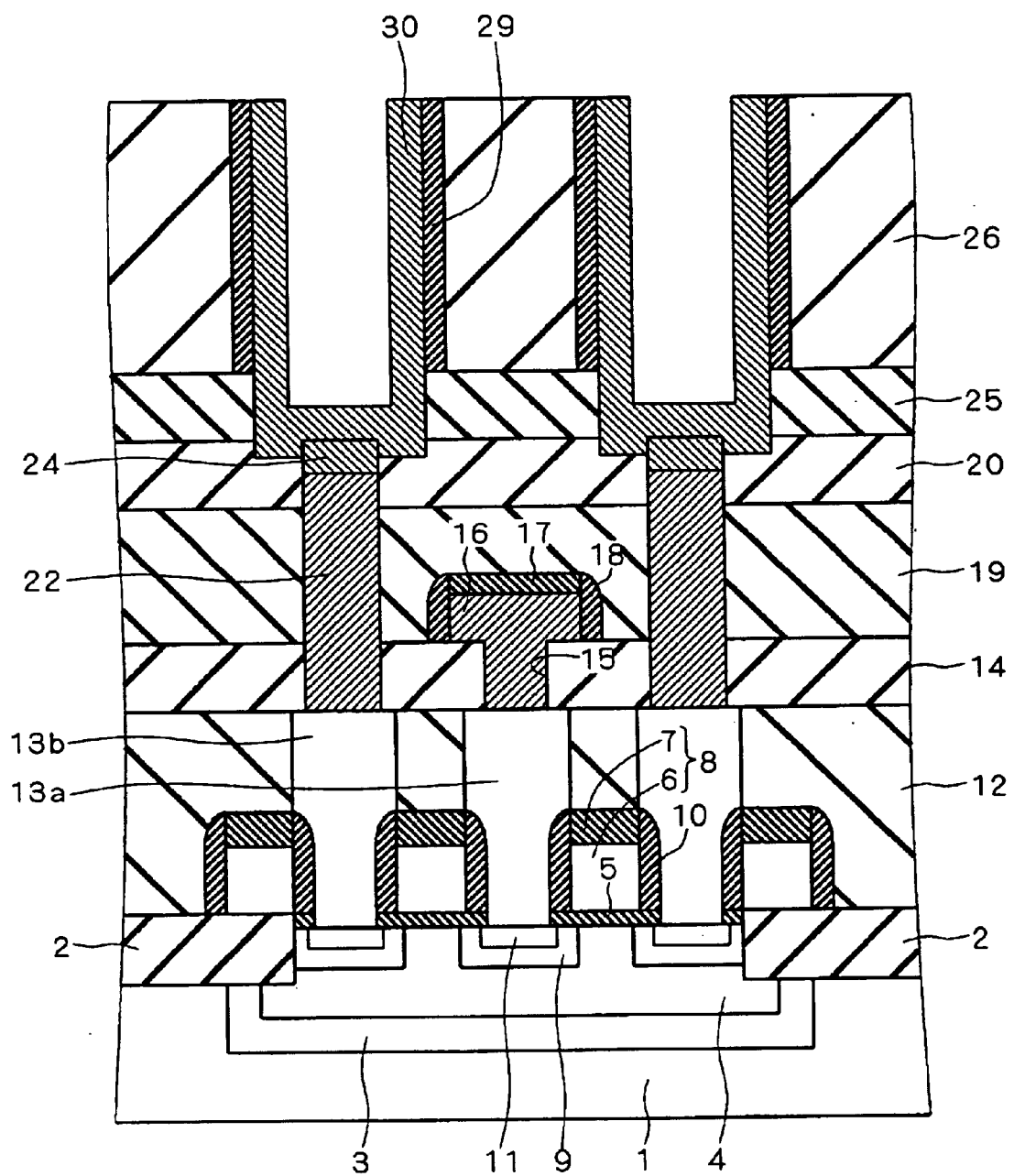

Next, referring to FIG. 15, the tungsten film 27 and a portion of the ruthenium film 30 that is present beyond the upper surface level of the silicon oxide film 26 are removed using a CMP technique or an etch-back technique. As a result, capacitor lower electrodes are obtained as portions of the ruthenium film 30 that are formed on the side surfaces and the bottom surfaces of the through holes 28. Next, damage caused in the ruthenium film 30 is removed by a heat treatment.

Figure 16:
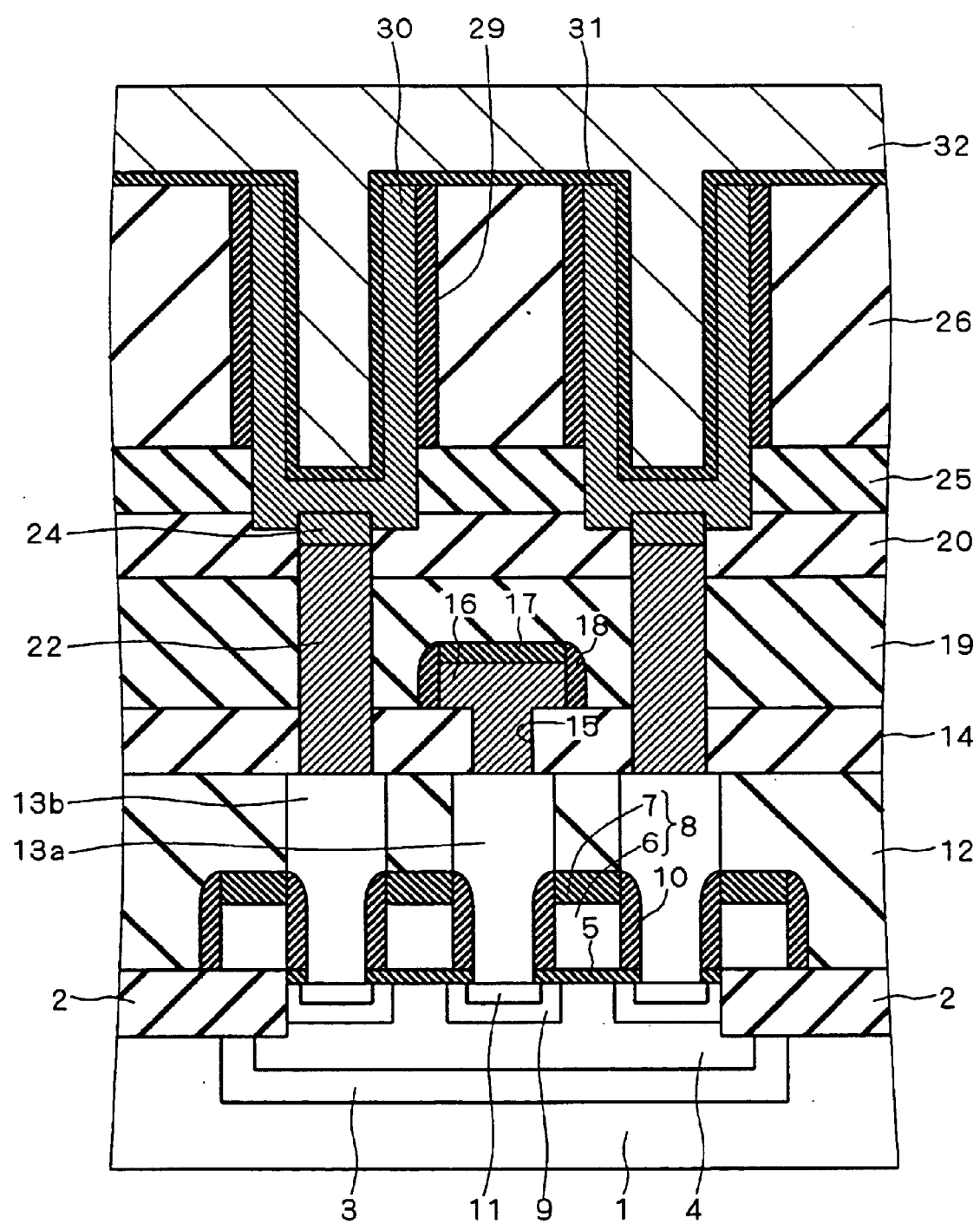

Next, referring to FIG. 16, using a CVD technique, a tantalum oxide film ($Ta_2O_5$) 31 having a film thickness of about 0.5 to 2 nm is entirely formed on the ruthenium film 30, the modified layer 29, and the silicon oxide film 26. The tantalum oxide film 31 functions as capacitor dielectric films. Subsequently, in order to crystallize the tantalum oxide film 31 and to improve the film quality thereof, a heat treatment at about 600 to 650° C. is performed in an oxygen ($O_2$) atmosphere. Then, using a sputtering technique or a CVD technique, a ruthenium film 32 having a film thickness of about 50 to 150 nm is entirely formed on the tantalum oxide film 31. The ruthenium film 32 functions as capacitor upper electrodes. With the process described above, a DRAM memory cell is completed that has an MOSFET and a capacitor connected thereto in series.

As described above, with the method of manufacturing a capacitor according to the first preferred embodiment, the bottom surface and the lower side surface of the through holes 28 are defined by the silicon nitride films 20 and 25. Silicon nitride has a higher adhesiveness to ruthenium than silicon oxide. For this reason, peeling-off of the ruthenium film 30 is suppressed in comparison with the case in which the silicon nitride films 20 and 25 are not formed and accordingly the bottom surface and the lower side surface of the through holes 28 are defined by the silicon oxide films 19 and 26.

Moreover, the silicon nitride film 20 is formed on the silicon oxide film 19. Consequently, even if cleaning solutions or etchant solutions used in manufacturing steps that follow the step shown in FIG. 14 infiltrate into the ruthenium film 30, it is possible to prevent the silicon oxide film 19 from being dissolved by the infiltrating cleaning solutions or the like.

In addition, in the method of manufacturing a capacitor according to the first preferred embodiment, the upper ends of the contact plugs 24 protrude from the bottom surfaces of the through holes 28. Therefore, the contact area between the ruthenium film 30 and the contact plugs 24 increases, which consequently improves adhesiveness therebetween, and therefore, peeling-off of the ruthenium film 30 is suppressed.

In addition, since the heat treatment is performed to crystallize the tantalum oxide film 31 and to improve the film quality thereof, a stress is applied to the ruthenium film 30 in such a way that a portion of the ruthenium film 30 that is formed on the bottom surface of each of the through holes 28 is raised in an upper direction and the portion of the ruthenium film 30 peels off from the contact plug 24. In the method of manufacturing a capacitor according to the first preferred embodiment, however, the upper ends of the contact plugs 24 protrude from the bottom surfaces of the through holes 28, and therefore, a bottom portion of the ruthenium film 30 has an upwardly-protruding shape. Therefore, the above-mentioned stress is alleviated, and it is therefore possible to prevent the ruthenium film 30 from peeling off from the contact plugs 24.

Furthermore, in the method of manufacturing a capacitor according to the first preferred embodiment, the tungsten film 27 is formed on the silicon oxide film 26, and the ruthenium film 30 is formed on the tungsten film 27. Tungsten has a higher adhesiveness to ruthenium than silicon oxide. For this reason, peeling-off of the ruthenium film 30 can be suppressed in comparison with the case in which the tungsten film 27 is not formed and accordingly the ruthenium film 30 is formed on the silicon oxide film 26.

In addition, in the method of manufacturing a capacitor according to the first preferred embodiment, the portions of the silicon oxide film 26 that define the side surfaces of the through holes 28 are nitrided, and thereby the modified layer 29 is formed in the side surfaces of the silicon oxide film 26. The modified layer 29, which is nitrided, has a higher adhesiveness to ruthenium than silicon oxide. For this reason, peeling-off of the ruthenium film 30 can be suppressed in comparison with the case in which the modified layer 29 is not formed and accordingly the ruthenium film 30 is formed on the side surfaces of the silicon oxide film 26.

Further, in the method of manufacturing a capacitor according to the first preferred embodiment, the ruthenium film 30 is directly formed on the side surfaces and the bottom surfaces of the through holes 28, so that the liner material, which has been described in the description of the background art, is not interposed therebetween. As a result, dissolution of the liner material is not caused by cleaning solutions and etchant solutions used in the manufacturing steps that follow the step shown in FIG. 14. Hence, peeling-off of the ruthenium film 30 caused by dissolution of the liner material can be prevented.

Second Preferred Embodiment

Figure 18:
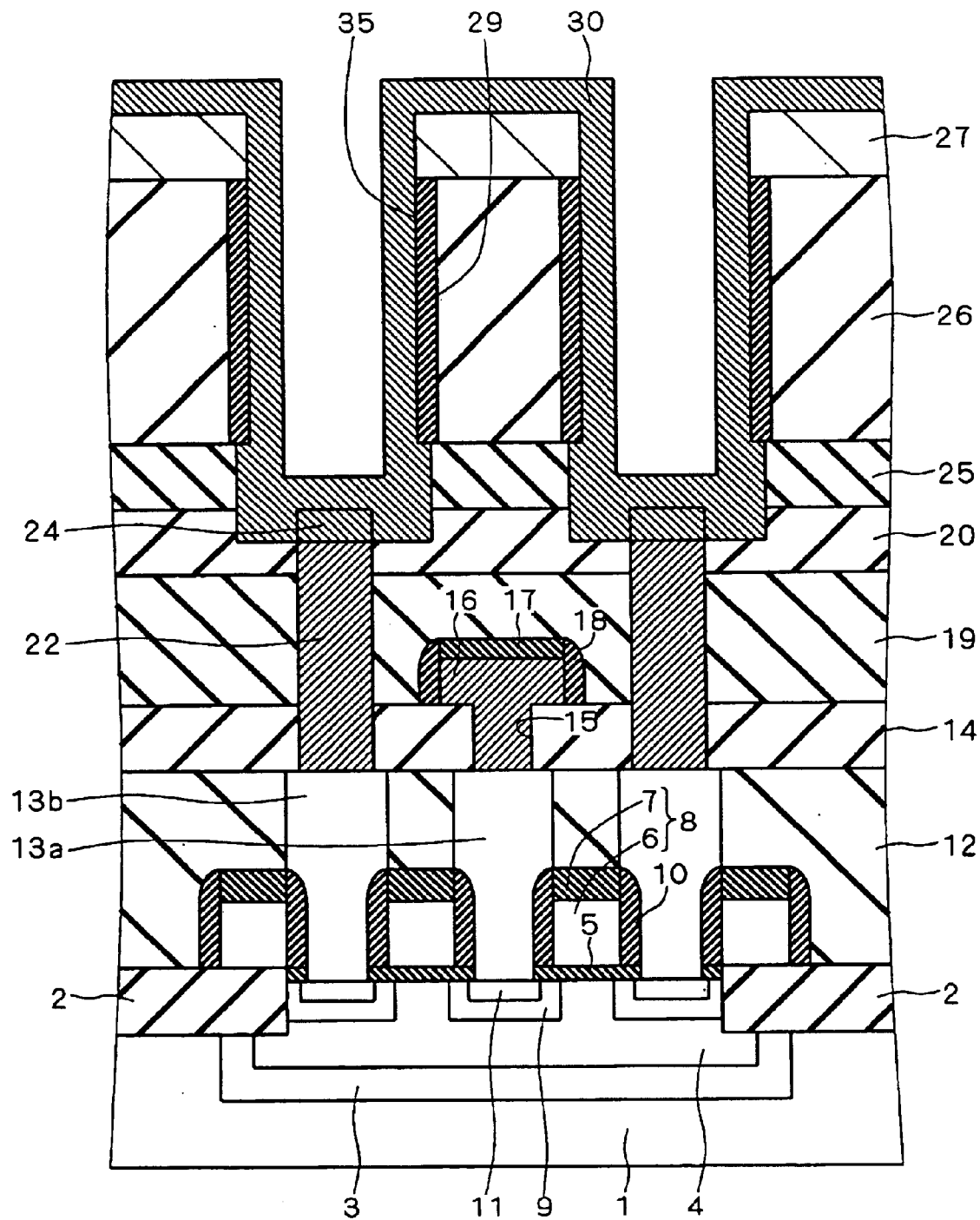
Figure 19:
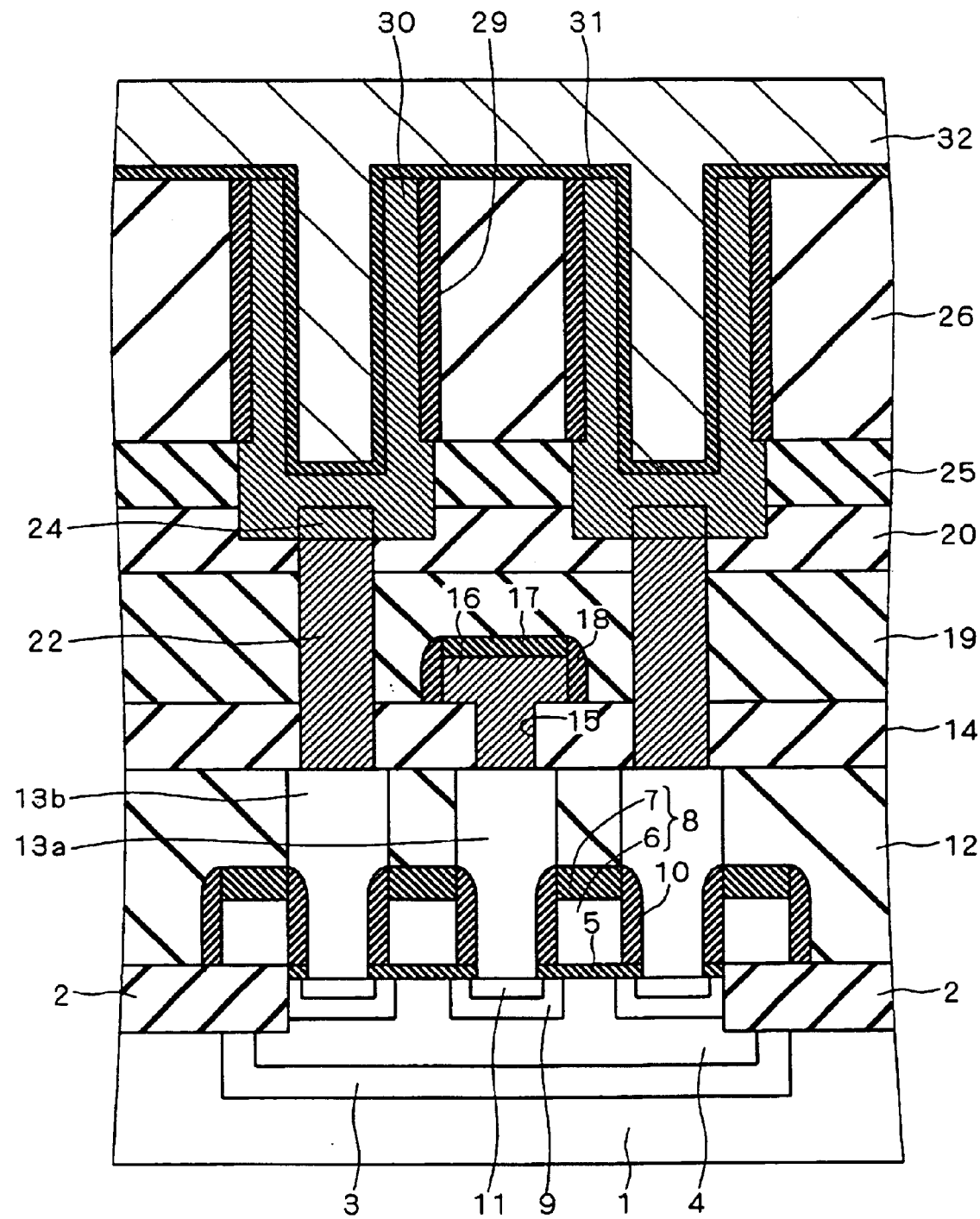
Figure 20:
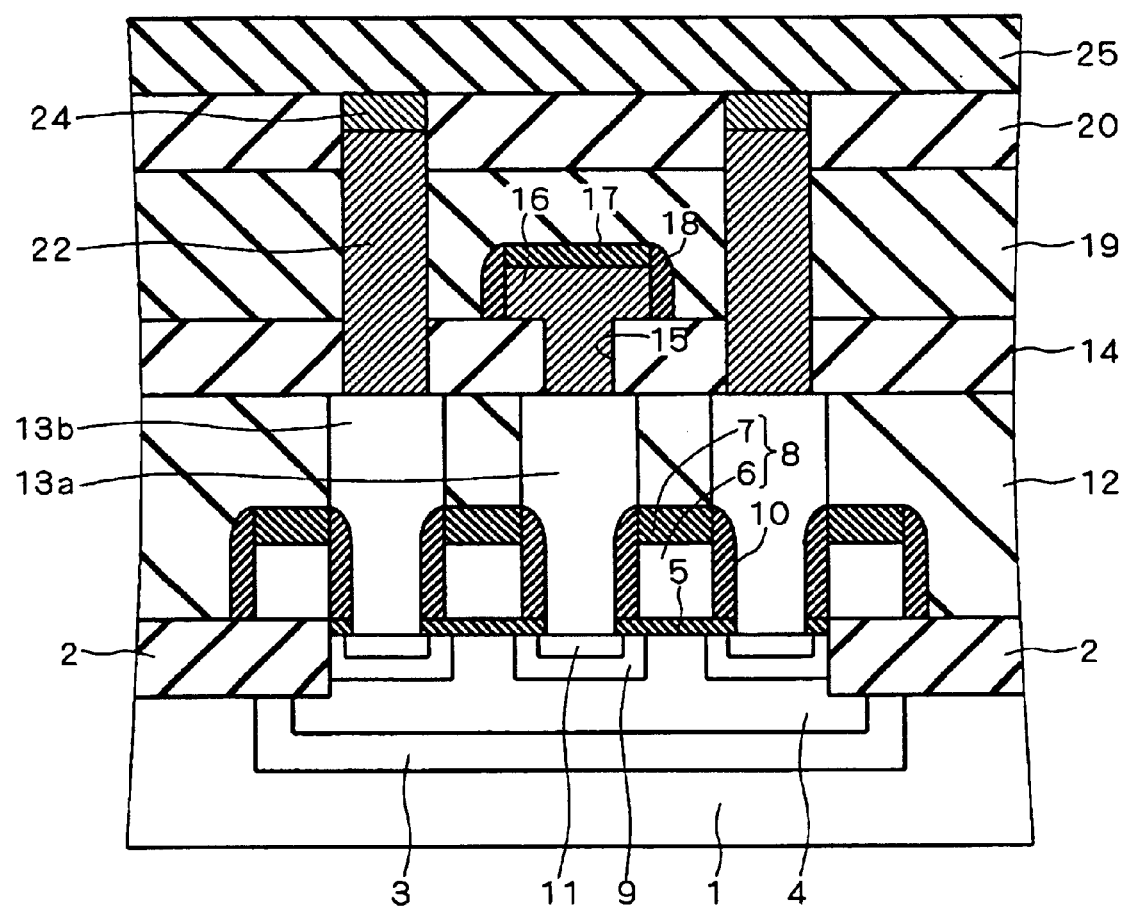
FIGS. 20 through 26 are cross-sectional views showing, in order of manufacturing steps, a method of manufacturing a capacitor according to a third preferred embodiment of the present invention.

FIGS. 17 through 19 are cross-sectional views showing, in order of manufacturing steps, a method of manufacturing a capacitor according to a second preferred embodiment of the present invention. First, the structure shown in FIG. 11 is obtained through the manufacturing steps similar to those in the foregoing first preferred embodiment. Next, referring to FIG. 17, using the tungsten film 27 as a metal hard mask, the silicon oxide film 26 and the silicon nitride films 20 and 25 are partially removed by an anisotropic dry etching technique. This forms through holes 35 each having a bottom surface defined by the silicon nitride film 20 and the contact plug 24, and a side surface defined by the silicon oxide film 26 and the silicon nitride films 20 and 25.

At this time, the etching for forming the through hole 35 is performed under the condition that the etching rate for silicon nitride is higher than the etching rate for silicon oxide. As a result, a diameter L3 of a portion of the through holes 35, the side surface of which is defined by the silicon nitride films 20 and 25, becomes larger than the diameter L2 of another portion of the through holes 35, the side surface of which is defined by the silicon oxide film 26. In other words, the through holes 35 have a side surface (hereafter referred to as "first side surface") that is defined by the silicon oxide film 26, and another side surface (hereafter referred to as "second side surface") that recedes from the first side surface and is defined by the silicon nitride films 20 and 25.

Next, referring to FIG. 18, the modified layer 29 and the ruthenium film 30 are formed in a similar manner to that in the first preferred embodiment. By forming the ruthenium film 30 using a CVD technique with good step coverage, the ruthenium film 30 is deposited not only on the first side surfaces of the through holes 35 but also on the second side surfaces thereof. As shown in FIG. 18, the ruthenium film 30 is formed directly on the first side surfaces, the second side surfaces, and the bottom surfaces of the through holes 35 and on the side surfaces and the upper surface of the tungsten film 27, so that the liner material, which has been described in the description of the background art, is not interposed therebetween.

After this point, similar manufacturing steps to those in the foregoing first preferred embodiment are carried out. First, referring to FIG. 19, the tungsten film 27 and a portion of the ruthenium film 30 that is present beyond the upper surface level of the silicon oxide film 26 are removed. Next, a heat treatment is performed in order to remove damage caused in the ruthenium film 30. Then, a tantalum oxide film 31 is formed. Subsequently, a heat treatment is performed in order to crystallize the tantalum oxide film 31 and to improve the film quality thereof. Thereafter, a ruthenium film 32 is formed. With the process described above, a DRAM memory cell is completed that has an MOSFET and a capacitor connected thereto in series.

Thus, the method of manufacturing a capacitor according to the second preferred embodiment can attain the following advantageous effect in addition to the advantageous effects described in the foregoing first preferred embodiment. Specifically, in the method of manufacturing a capacitor according to the second preferred embodiment, each of the through holes 35 has the first side surface that is defined by the silicon oxide film 26 and the second side surface that recedes from the first side surface and is defined by the silicon nitride films 20 and 25, and the ruthenium film 30 is formed not only on the first side surfaces of the through holes 35 but also the second side surfaces thereof In other words, the lower portions of the ruthenium film 30 are formed so as to enter underneath the silicon oxide film 26 (modified layer 29). As a consequence, peeling-off of the ruthenium film 30 is can be suppressed because of this shape.

Third Preferred Embodiment

FIGS. 20 through 26 are cross-sectional views showing, in order of manufacturing steps, a method of manufacturing a capacitor according to a third preferred embodiment of the present invention. First, the structure shown in FIG. 10 is obtained through the manufacturing steps similar to those in the foregoing first preferred embodiment. Next, referring to FIG. 20, using a CVD technique, a silicon nitride film 25 having a film thickness of about 50 to 150 nm is entirely formed on the silicon nitride film 20 and the contact plugs 24.

Figure 21:
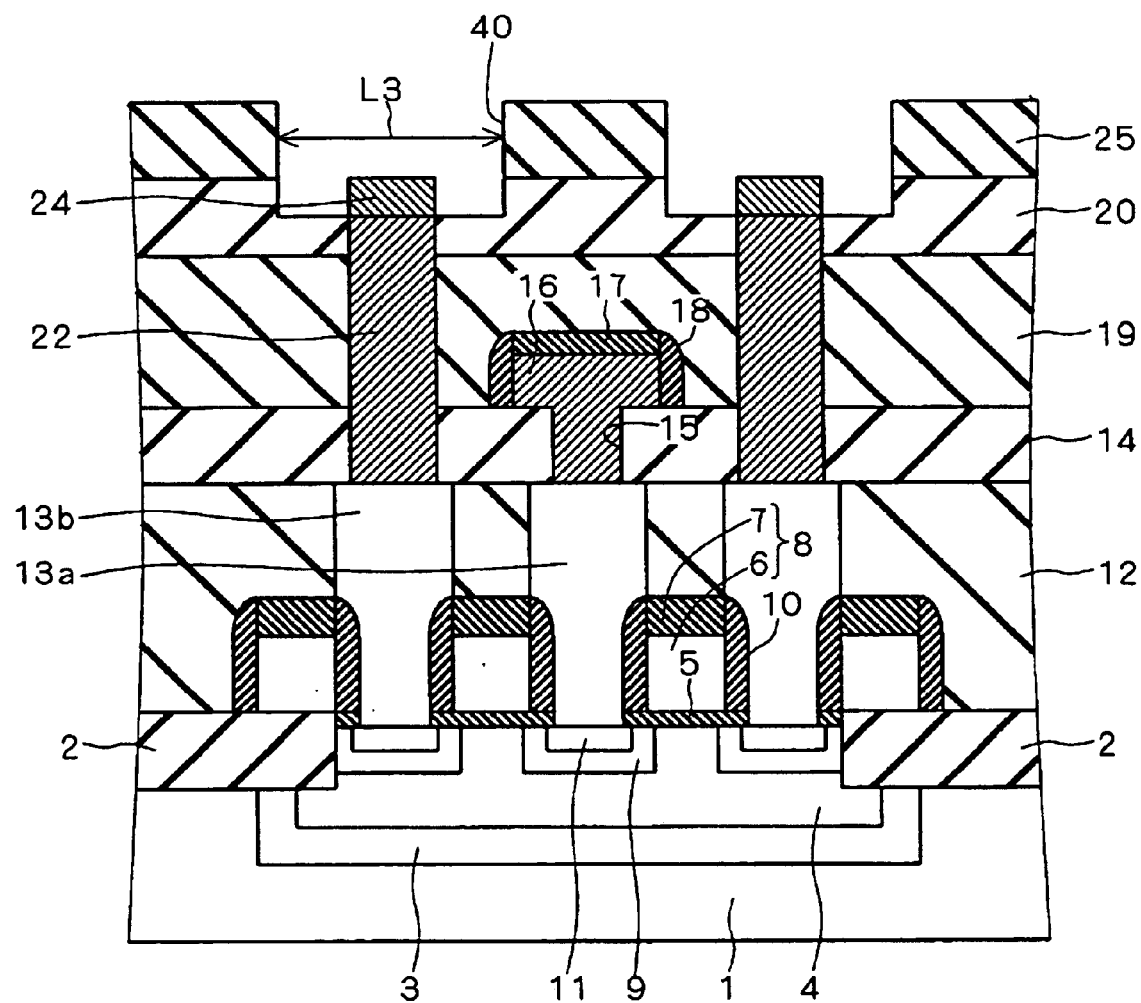

Next, referring to FIG. 21, using a photolithography technique and an anisotropic dry etching technique, the silicon nitride films 25 and 20 are partially removed. This forms contact holes 40 each having a bottom surface that is defined by the silicon nitride film 20 and the contact plug 24 and a side surface that is defined by the silicon nitride films 20 and 25. As shown in FIG. 21, the contact plugs 24 protrude from the bottom surfaces of the contact holes 40.

Figure 22:
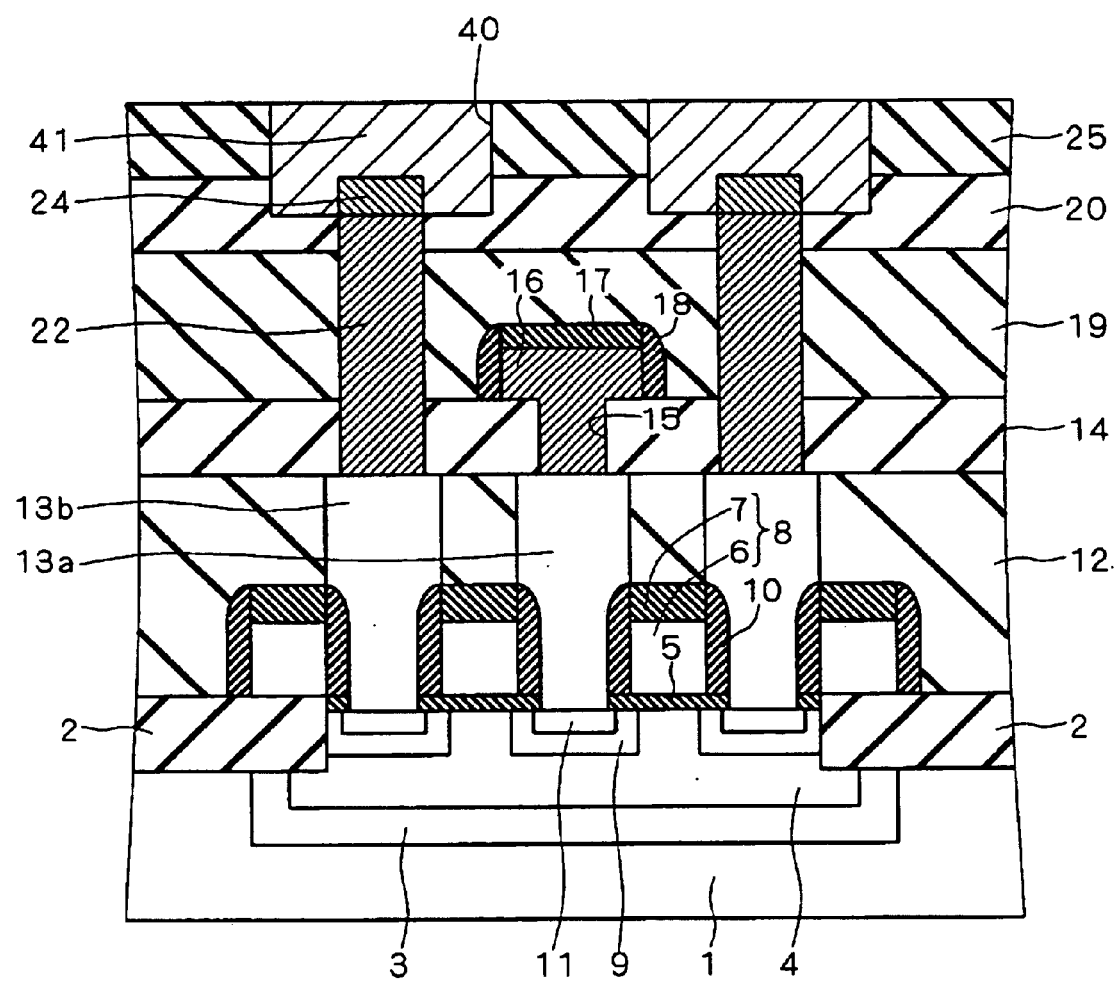

Next, referring to FIG. 22, using a sputtering technique, a seed layer of ruthenium (not shown) is formed on the side surfaces and the bottom surfaces of the contact holes 40, and thereafter, using a CVD technique, a ruthenium film 41 having a thickness such that it can completely fill up the contact holes 40 is formed in the contact holes 40 and on the silicon nitride film 25. It should be noted that the formation of the seed layer may be omitted. In addition, in place of the ruthenium film 41, it is possible to form a tungsten film, a tungsten nitride film, a titanium nitride film, a titanium nitride silicon film, an aluminum titanium nitride film, a tantalum nitride film, a tantalum nitride silicon film, or a tungsten nitride silicon film. Subsequently, a portion of the ruthenium film 41 that is present beyond the upper surface level of the silicon nitride film 25 is removed, using a CMP technique or an etch-back technique.

Figure 23:
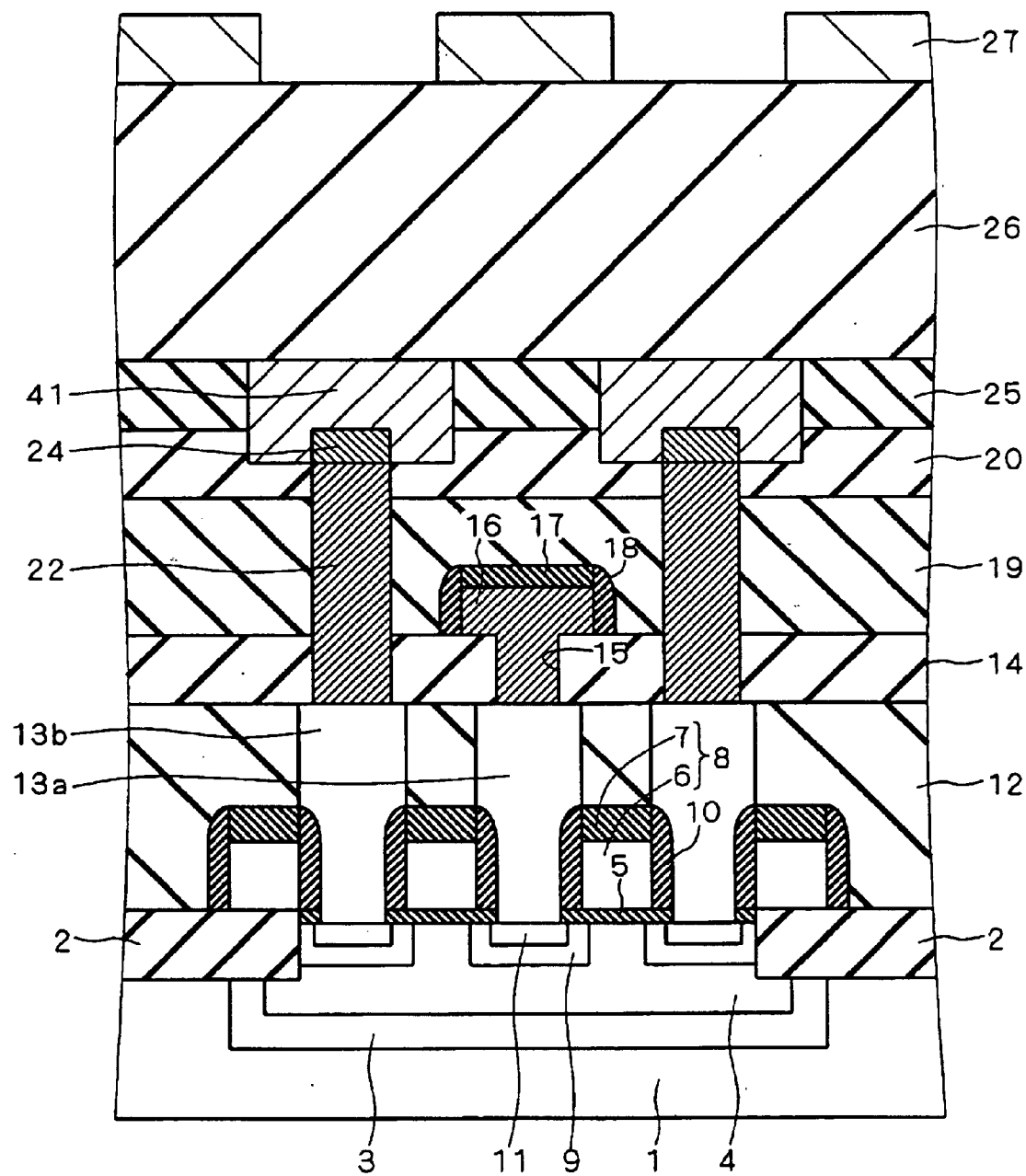

Next, referring to FIG. 23, the silicon oxide film 26 is entirely formed on the ruthenium film 41 and the silicon nitride film 25 in a similar manner to that in the foregoing first preferred embodiment. Then, the tungsten film 27 is formed in a similar manner to that in the foregoing first preferred embodiment.

Figure 24:
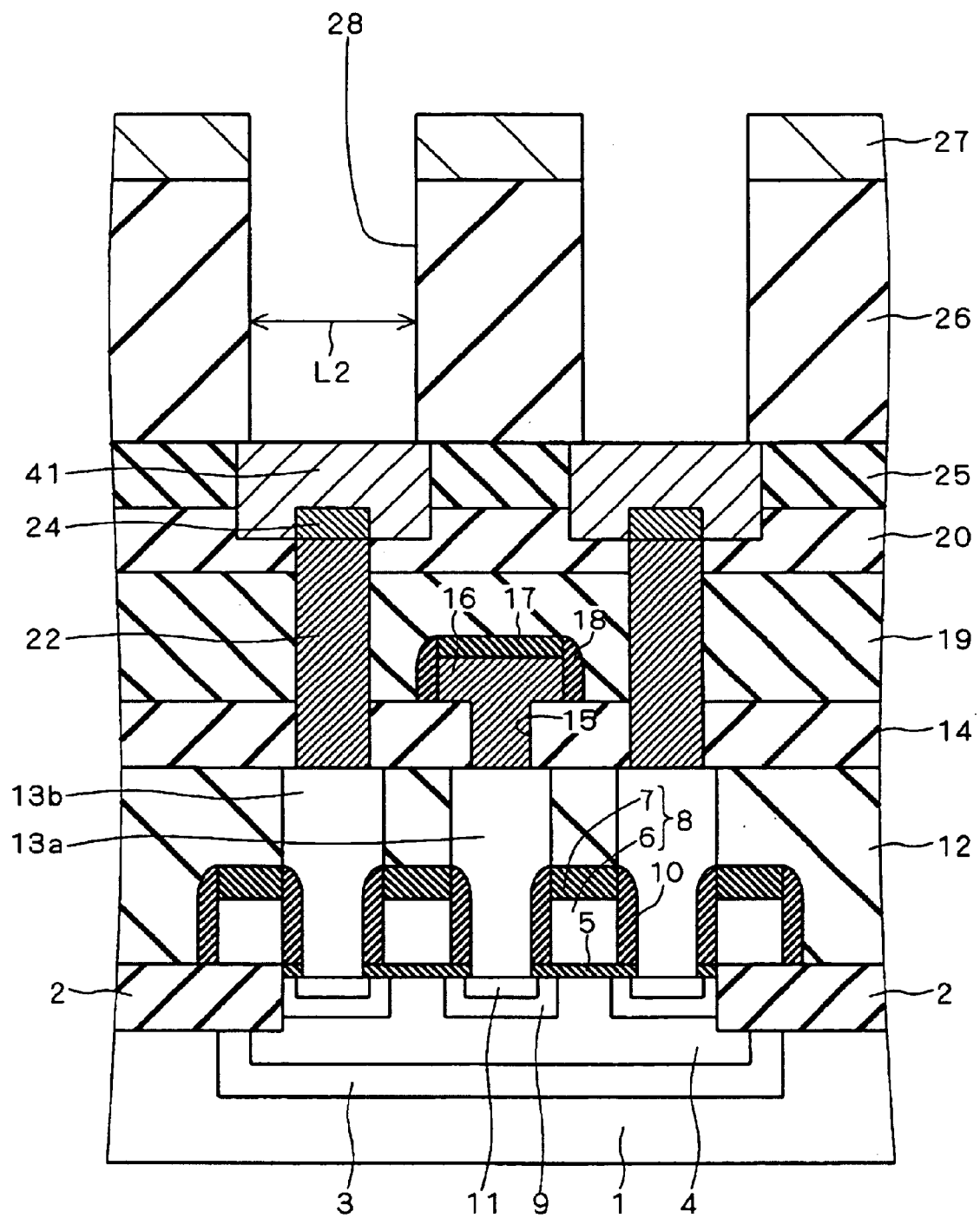

Subsequently, referring to FIG. 24, using the tungsten film 27 as a metal hard mask and using the ruthenium film 41 as an etch stopper, the silicon oxide film 26 is partially removed by an anisotropic dry etching technique. This forms through holes 28 each having a bottom surface that is defined by the ruthenium film 41 and a side surface that is defined by the silicon oxide film 26. In this third preferred embodiment, the diameter L2 of the through holes 28 is smaller than the diameter L3 of the contact holes 40 shown in FIG. 21.

Figure 25:
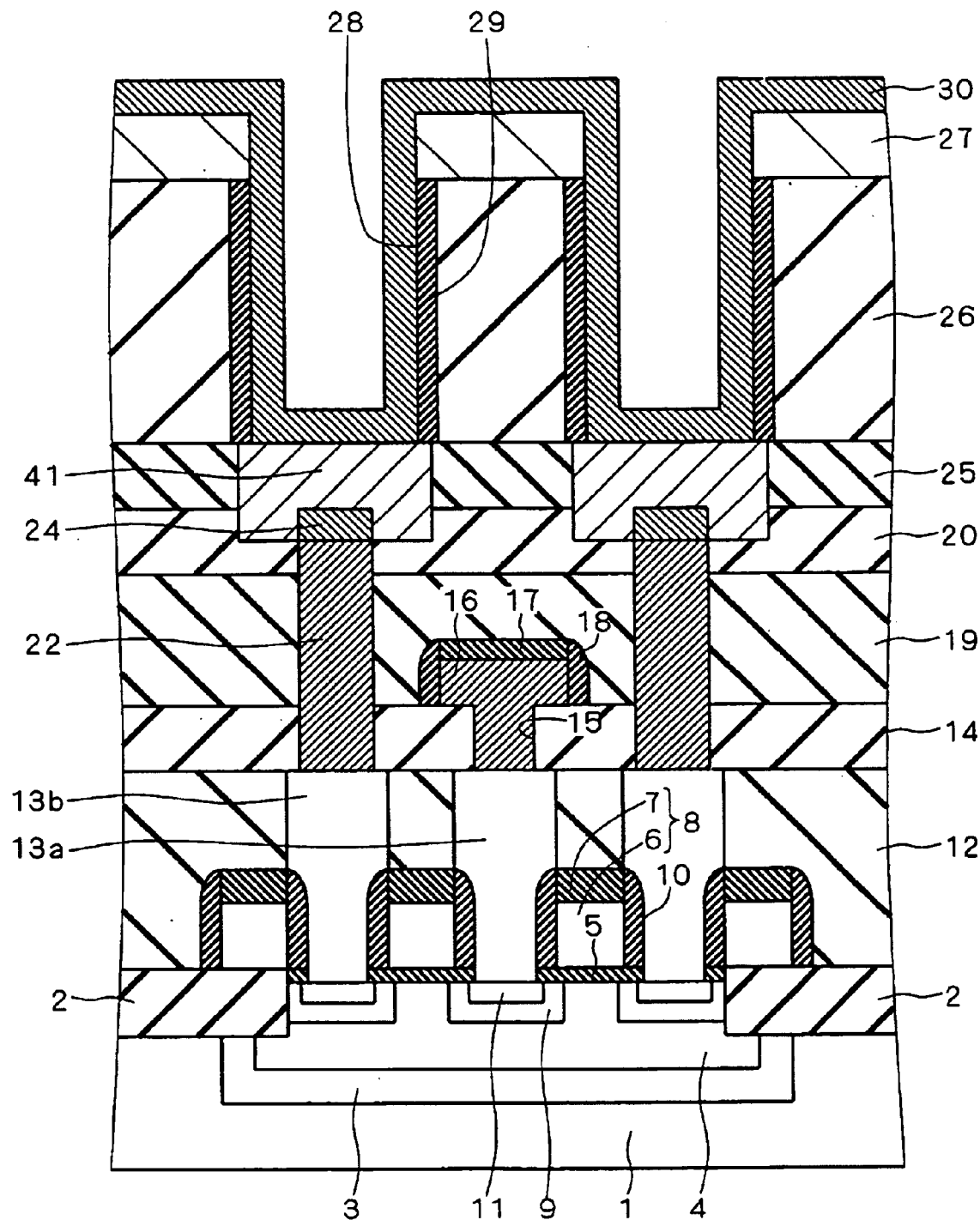
Figure 26:
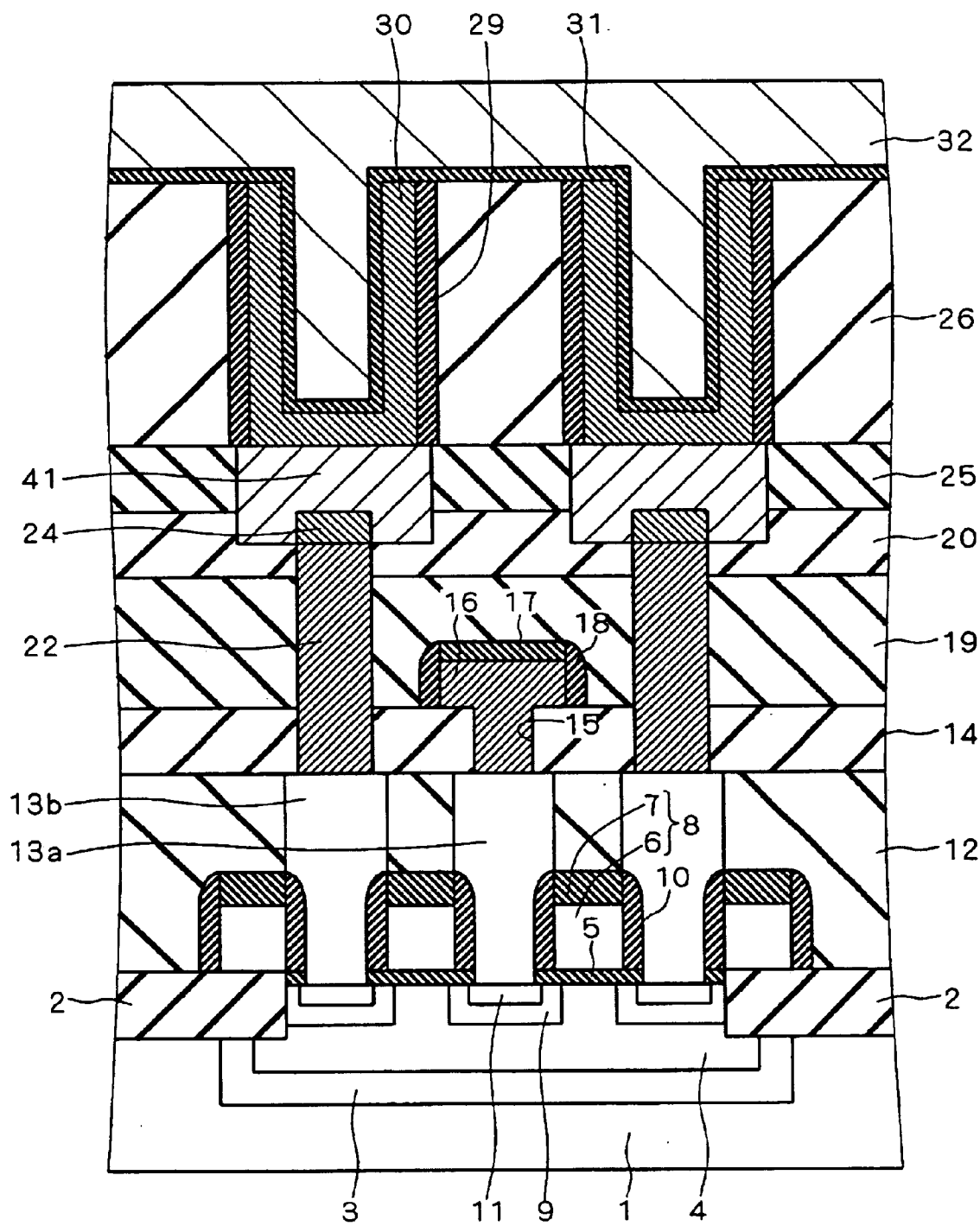
Figure 27:
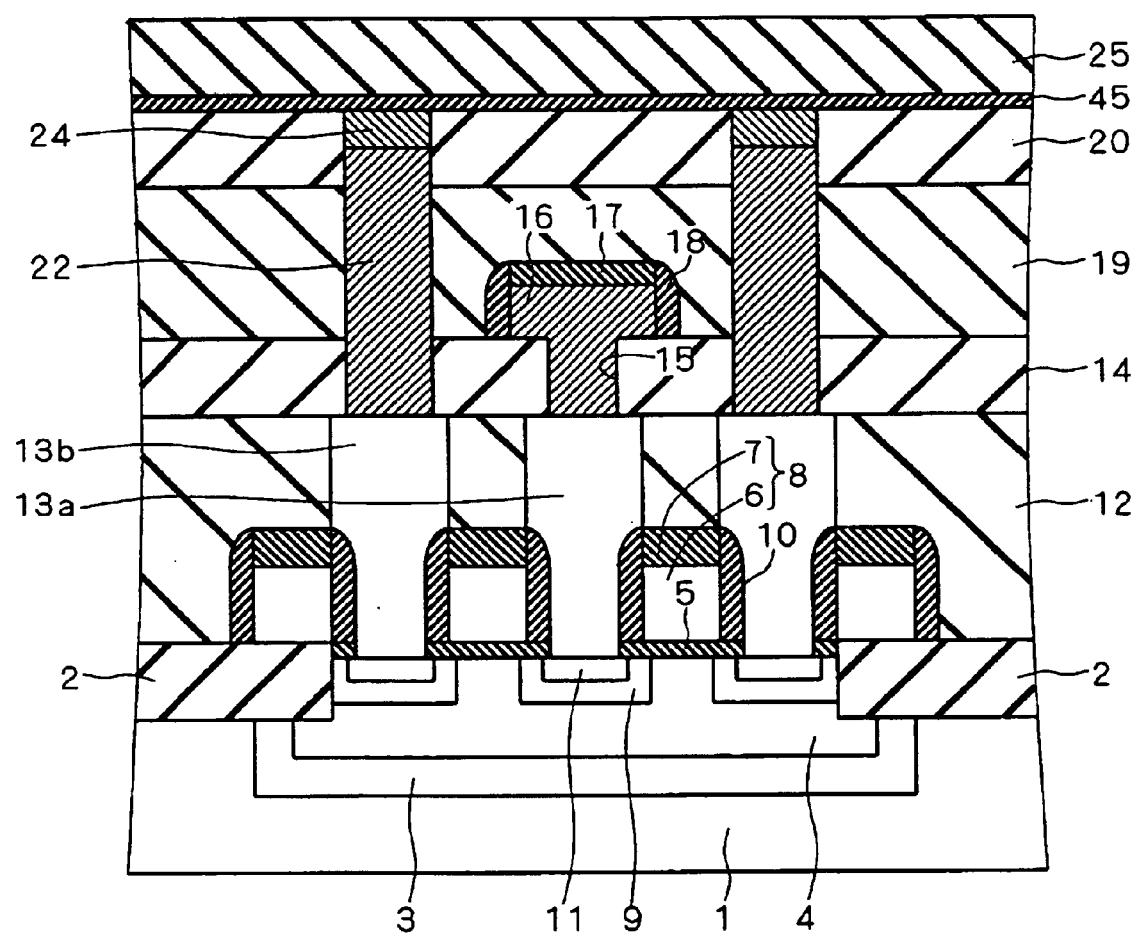
FIGS. 27 through 30 are cross-sectional views showing, in order of manufacturing steps, a method of manufacturing a capacitor according to a fourth preferred embodiment of the present invention.

Then, referring to FIG. 25, the modified layer 29 and the ruthenium film 30 are formed in a similar manner to that in the foregoing first preferred embodiment. As shown in FIG. 25, the ruthenium film 30 is formed directly on the side surfaces and the bottom surfaces of the through holes 28, so that the liner material, which has been described in the description of the background art, is not interposed therebetween.

After this point, similar manufacturing steps to those in the foregoing first preferred embodiment are carried out. First, referring to FIG. 26, the tungsten film 27 and a portion of the ruthenium film 30 that is present beyond the upper surface level of the silicon oxide film 26 are removed. Next, a heat treatment is performed in order to remove damage caused in the ruthenium film 30. Then, a tantalum oxide film 31 is formed. Subsequently, a heat treatment is performed in order to crystallize the tantalum oxide film 31 and to improve the film quality thereof. Thereafter, a ruthenium film 32 is formed. With the process described above, a DRAM memory cell is completed that has an MOSFET and a capacitor connected thereto in series.

Thus, the method of manufacturing a capacitor according to the third preferred embodiment can attain the following advantageous effect in addition to the advantageous effects described in the foregoing first preferred embodiment. Specifically, in the method of manufacturing a capacitor according to the third preferred embodiment, the ruthenium film 41 that functions as part of the capacitor lower electrodes is formed so as to enter underneath the silicon oxide film 26 (modified layer 29). As a result, peeling-off of the ruthenium film 41 can be suppressed because of this shape.

Fourth Preferred Embodiment

FIGS. 27 through 30 are cross-sectional views showing, in order of manufacturing steps, a method of manufacturing a capacitor according to a fourth preferred embodiment of the present invention. First, the structure shown in FIG. 10 is obtained through the manufacturing steps similar to those in the foregoing first preferred embodiment. Next, referring to FIG. 27, a tantalum oxide film 45 having a film thickness of about 0.5 to 2 nm is entirely formed on the silicon nitride film 20 and the contact plugs 24, using a CVD technique. It should be noted that, in place of the tantalum oxide film 45, an aluminum oxide film ($Al_2O_3$) may be formed. Thereafter, in order to crystallize the tantalum oxide film 45, a heat treatment is performed in an oxygen atmosphere. Then, using a CVD technique, a silicon nitride film 25 having a film thickness of about 50 to 150 nm is entirely formed on the tantalum oxide film 45.

Figure 28:
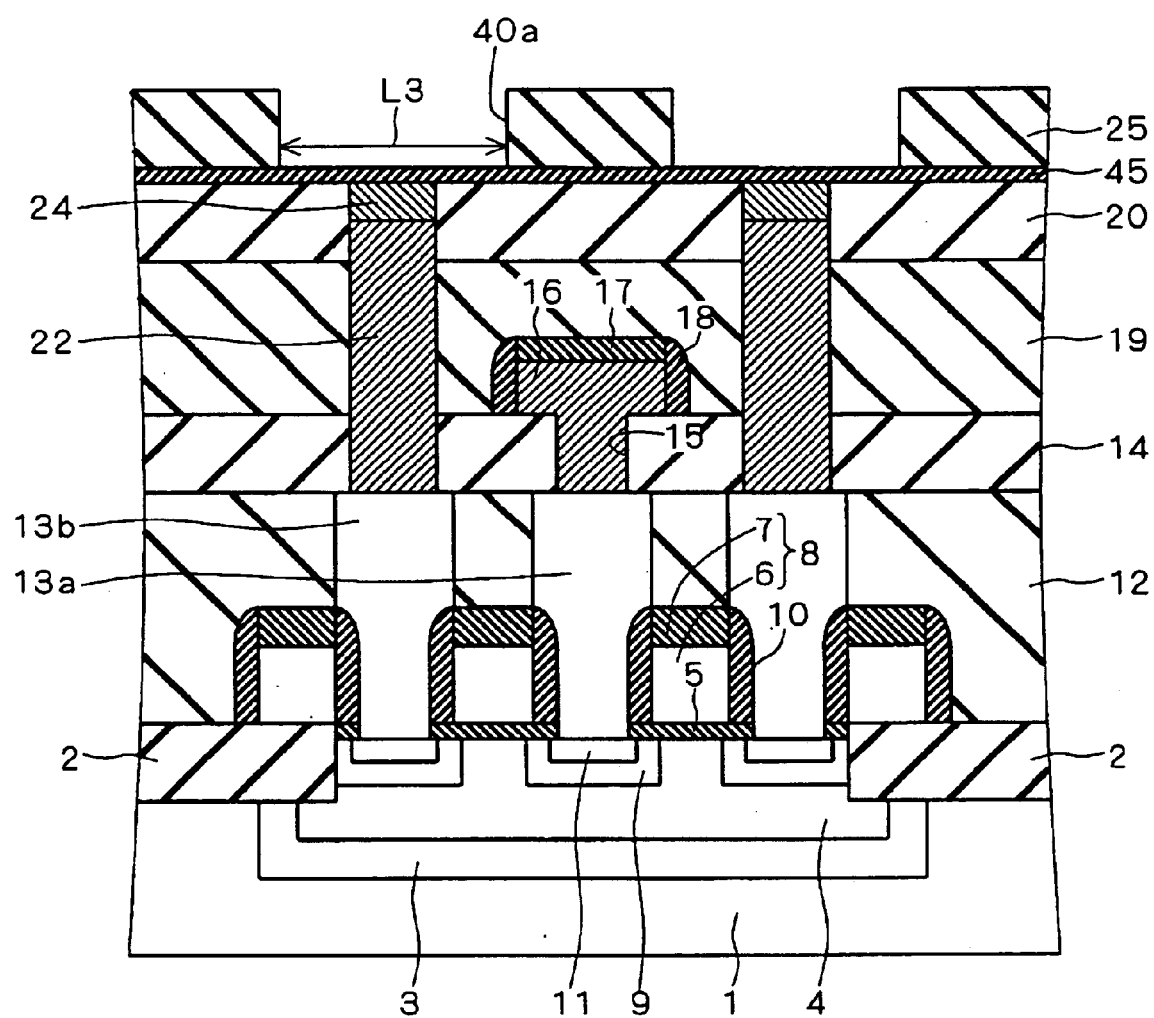

Next, referring to FIG. 28, the silicon nitride film 25 is partially removed using a photolithography technique and an anisotropic dry etching technique. This etching is performed under the condition that the etching rate for tantalum oxide is sufficiently greater than the etching rate for silicon nitride. As a result, the tantalum oxide film 45 functions as an etch stopper, forming contact holes 40a each having a bottom surface that is defined by the tantalum oxide film 45 and a side surface that is defined by the silicon nitride film 25.

Figure 29:
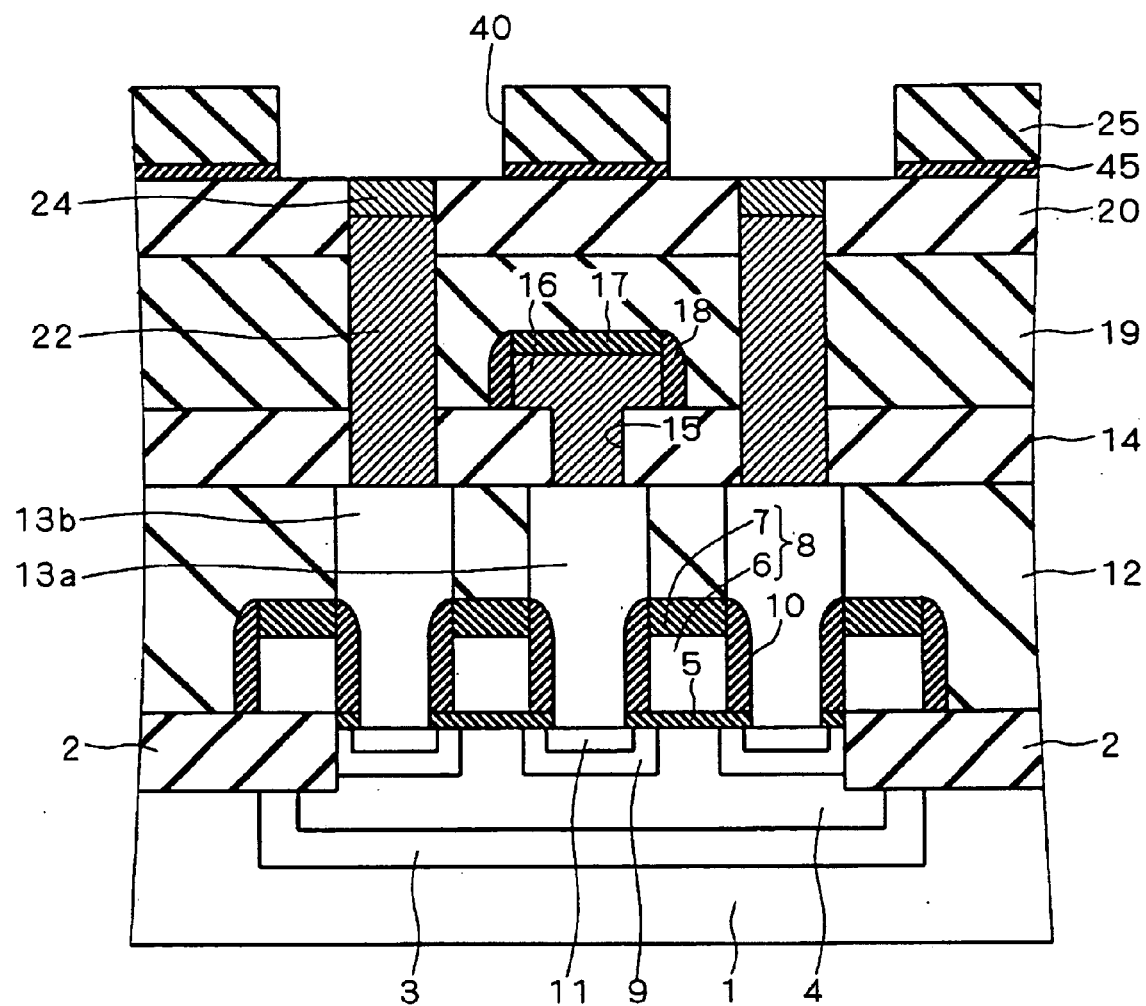

Next, referring to FIG. 29, portions of the tantalum oxide film 45 that define the bottom surfaces of the contact holes 40a are removed by etching. This forms contact holes 40 each having a bottom surface that is defined by the silicon nitride film 20 and the contact plug 24, and having a side surface that is defined by the silicon nitride film 25 and the tantalum oxide film 45.

Figure 30:
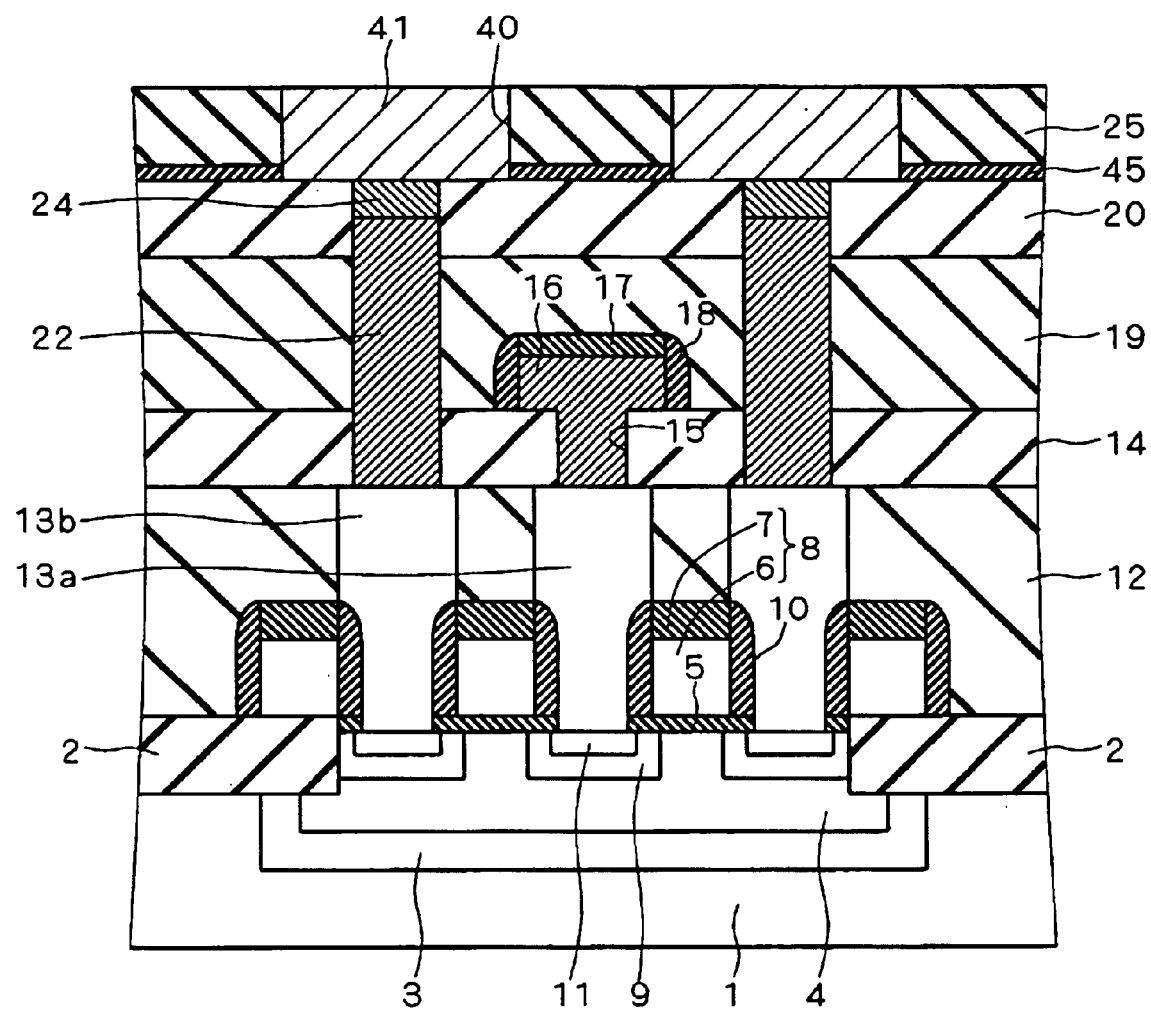

Next, referring to FIG. 30, a ruthenium film 41 is formed in the contact holes 40 in a similar manner to that in the foregoing third preferred embodiment. After this point, the manufacturing steps subsequent to that shown in FIG. 23 are carried out, as in the foregoing third preferred embodiment.

Thus, in the method of manufacturing a capacitor according to the fourth preferred embodiment, the silicon nitride film 25 is removed using the tantalum oxide film 45 as an etch stopper, and thereafter the tantalum oxide film 45 is removed, thereby forming the contact holes 40. Therefore, control of the etching for forming the contact holes 40 can be performed easily in comparison with the foregoing third preferred embodiment. For this reason, the contact plugs 41, which function as part of the capacitor lower electrodes, can be formed with high accuracy.

Fifth Preferred Embodiment

Figure 31:
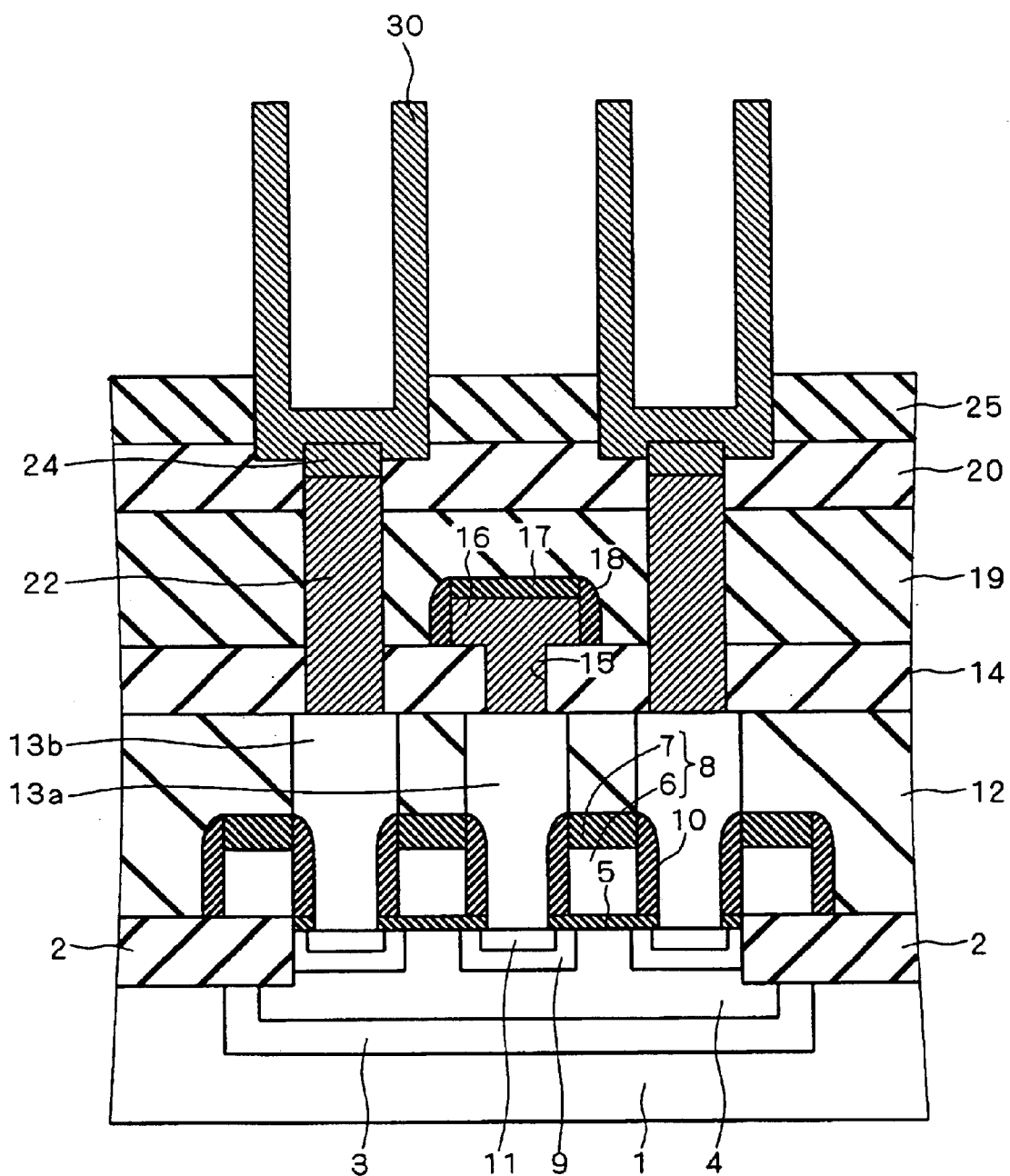
FIGS. 31 and 32 are cross-sectional views showing, in order of manufacturing steps, a method of manufacturing a capacitor according to a fifth preferred embodiment of the present invention.
Figure 32:
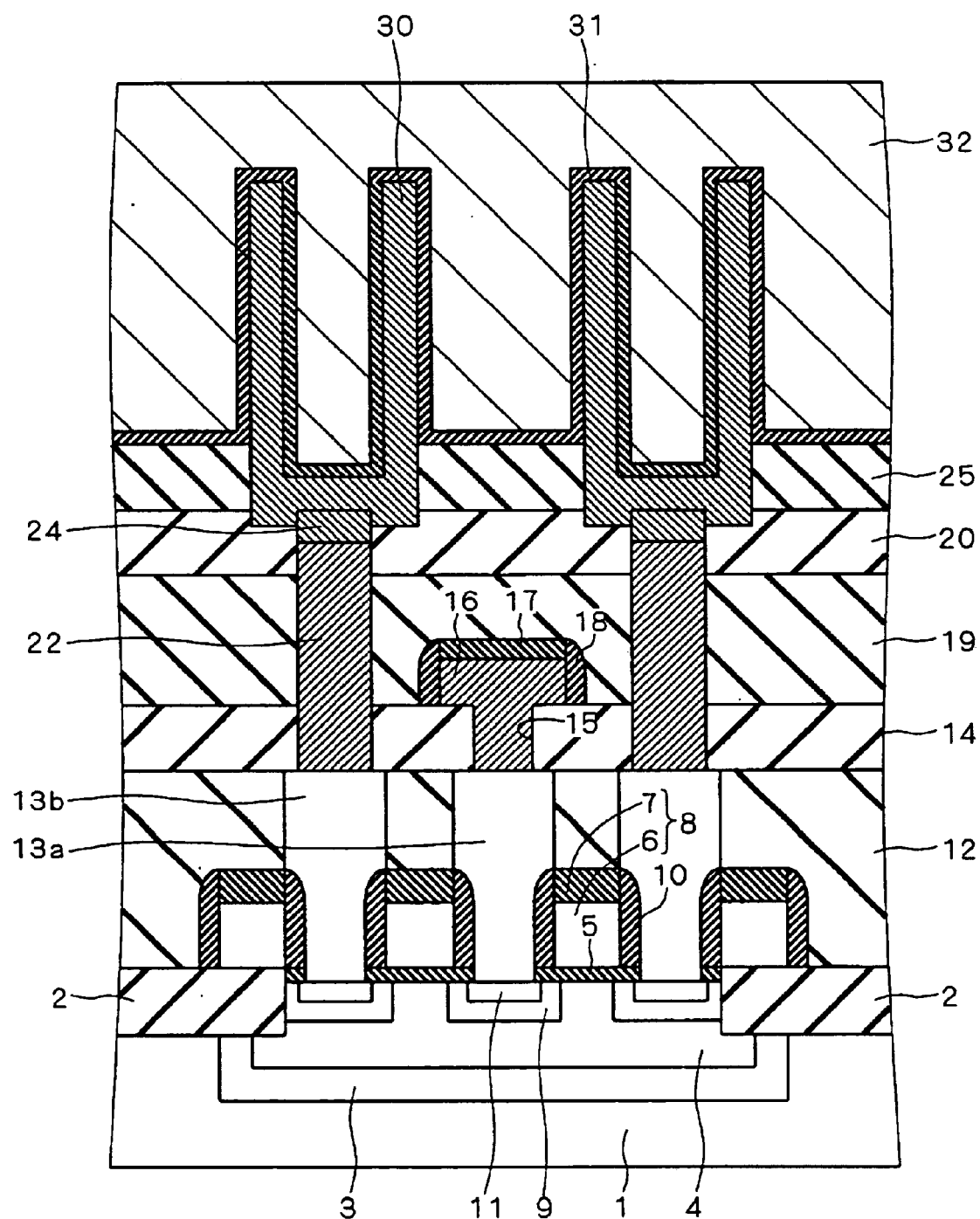
Figure 33:
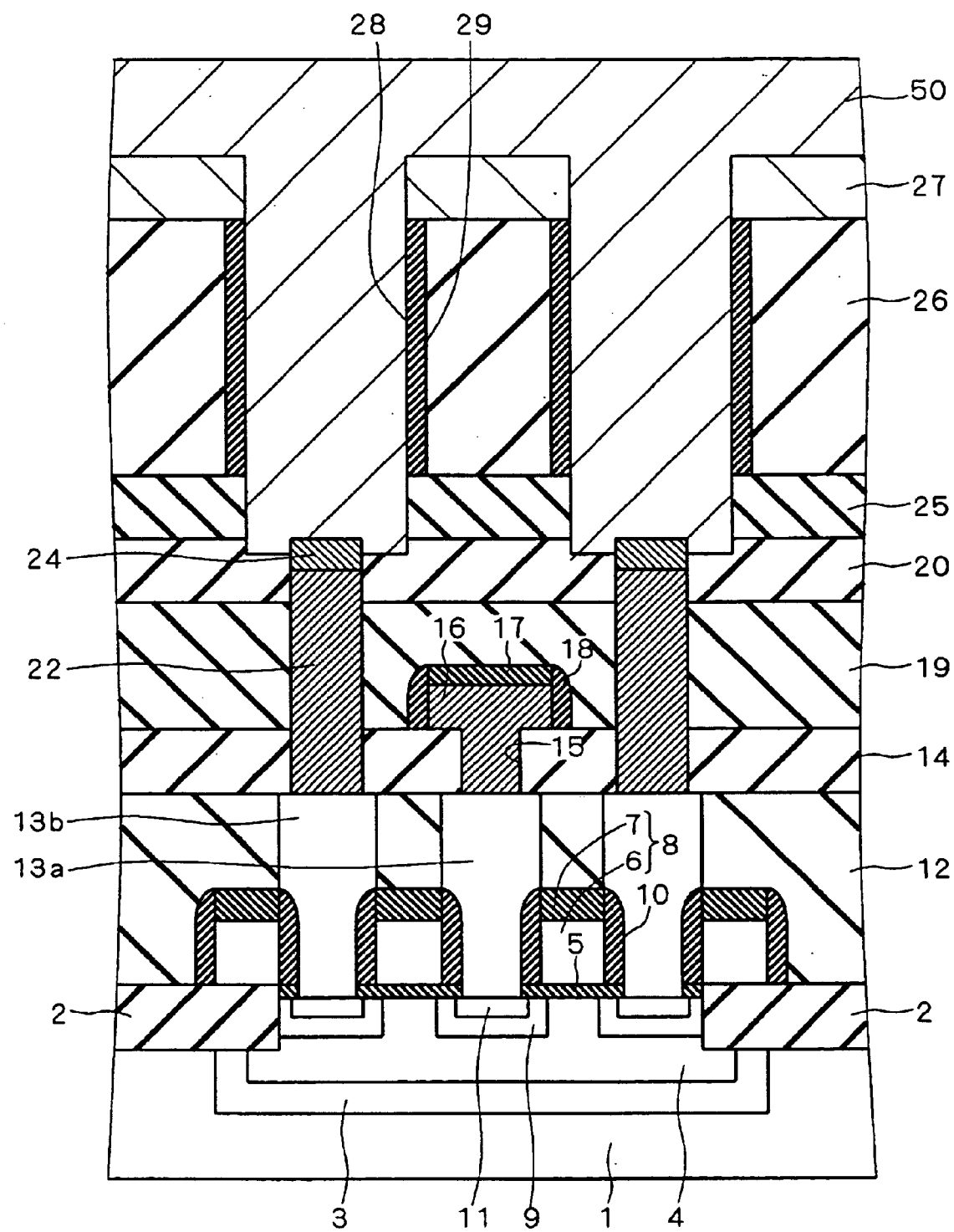
FIGS. 33 through 36 are cross-sectional views showing, in order of manufacturing steps, a method of manufacturing a capacitor according to a sixth preferred embodiment of the present invention.

FIGS. 31 and 32 are cross-sectional views showing, in order of manufacturing steps, a method of manufacturing a capacitor according to a fifth preferred embodiment of the present invention. First, the structure shown in FIG. 15 is obtained through the manufacturing steps similar to those in the foregoing first preferred embodiment. Next, referring to FIG. 31, the silicon oxide film 26 and the modified layer 29 are removed by wet etching. This produces a structure in which tubular-shaped portions of the ruthenium film 30, an upper surface of each of which is opened, protrude from an upper surface of the silicon nitride film 25. The ruthenium film 30 is supported at its lower portions by the silicon nitride films 20 and 25 and the contact plugs 24, which have a high adhesiveness to ruthenium. Therefore, the portions of the ruthenium film 30 that protrude from the silicon nitride film 25 do not collapse. Next, damage caused in the ruthenium film 30 is removed by a heat treatment.

Next, referring to FIG. 32, a tantalum oxide film 31 having a film thickness of about 0.5 to 2 nm is entirely formed on the ruthenium film 30 and the silicon nitride film 25, using a CVD technique. Subsequently, a heat treatment is carried out in order to crystallize the tantalum oxide film 31 and to improve the film quality thereof. Then, using a sputtering technique or a CVD technique, a ruthenium film 32 having a film thickness of about 50 to 150 nm is entirely formed on the tantalum oxide film 31. With the process described above, a DRAM memory cell is completed that has an MOSFET and a capacitor connected thereto in series.

Thus, with the method of manufacturing a capacitor according to the fifth preferred embodiment, the areas in the capacitor lower electrode and the capacitor upper electrode that oppose each other are larger than those in the capacitor according to the foregoing first preferred embodiment. Therefore, it is possible to obtain a capacitor having a larger capacitance than the capacitor according to the foregoing first preferred embodiment.

It should be noted that the above description illustrates an example in which the invention according to this fifth preferred embodiment is applied to the method of manufacturing a capacitor according to the foregoing first preferred embodiment, but the invention according to the fifth preferred embodiment may be applied to any of the foregoing second to fourth preferred embodiments as well as the later-described seventh preferred embodiment.

Sixth Preferred Embodiment

FIGS. 33 through 36 are cross-sectional views showing, in order of manufacturing steps, a method of manufacturing a capacitor according to a sixth preferred embodiment of the present invention. First, the structure shown in FIG. 13 is obtained through the manufacturing steps similar to those in the first preferred embodiment. Next, referring to FIG. 33, using a sputtering technique, a seed layer of ruthenium (not shown) is formed on the side surfaces and the bottom surfaces of the through holes 28, and thereafter, using a CVD technique, a ruthenium film 50 having a thickness such that it can completely fill up the through holes 28 is entirely formed. It should be noted that the formation of the seed layer may be omitted.

Figure 34:
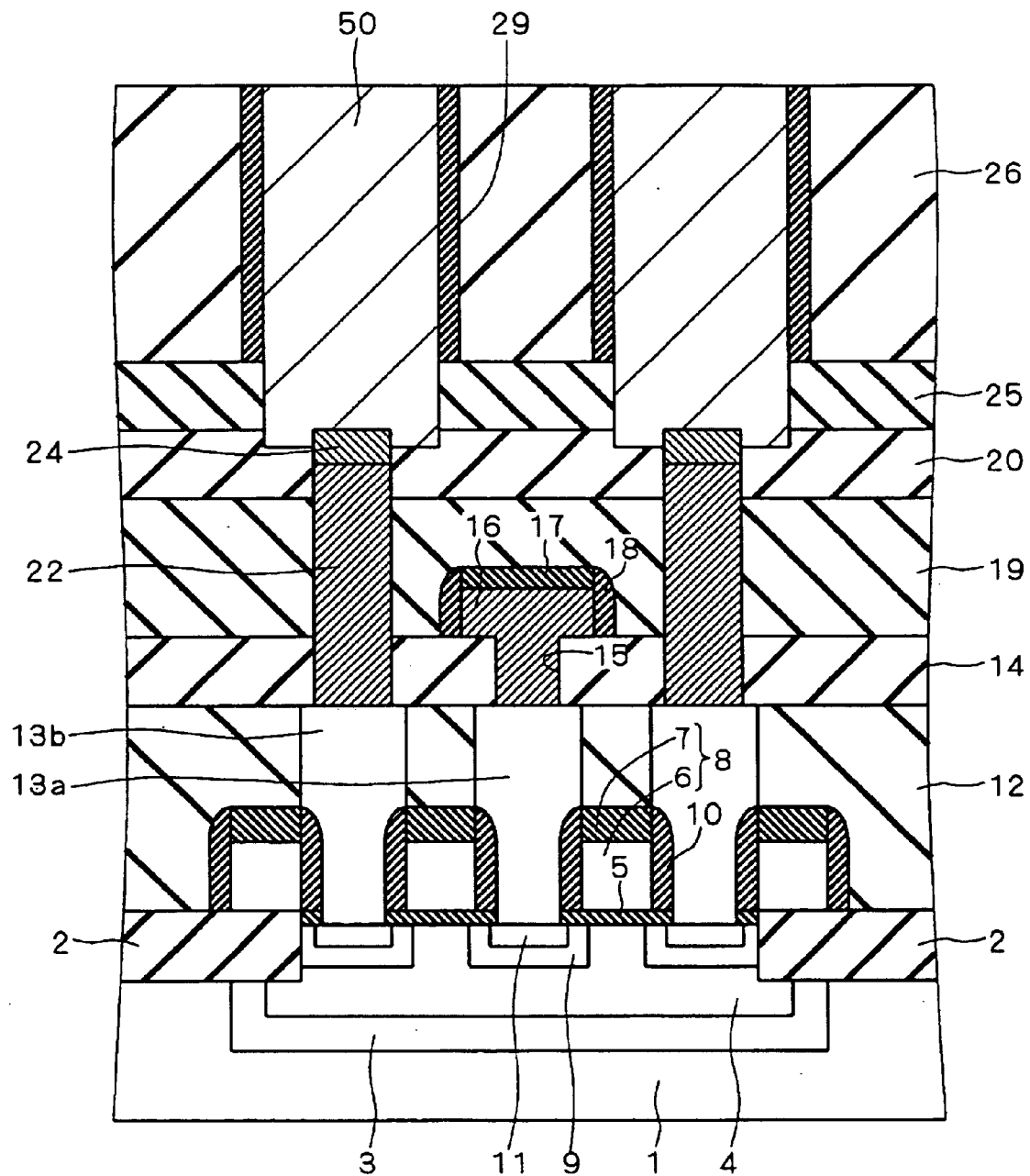

Next, referring to FIG. 34, the tungsten film 27 and a portion of the ruthenium film 50 that is present beyond the upper surface level of the silicon oxide film 26 are removed by a CMP technique or an etch-back technique. This produces capacitor lower electrodes, which are formed by the portions of the ruthenium film 50 that fill up the through holes 28.

Figure 35:
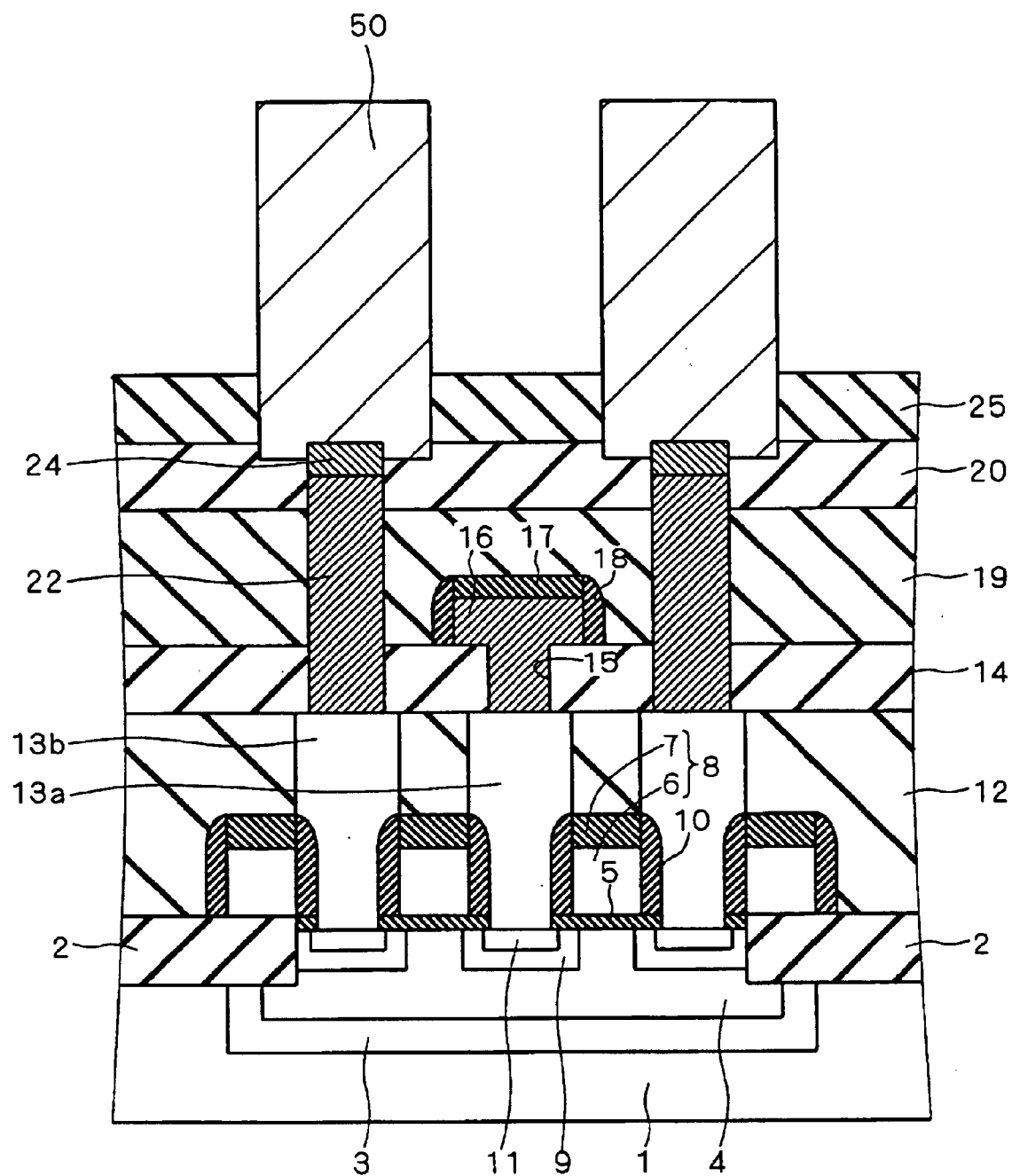

Next, referring to FIG. 35, the silicon oxide film 26 and the modified layer 29 are removed by wet etching. This produces a structure in which columnar portions of the ruthenium film 50 protrude from the upper surface of the silicon nitride film 25. The ruthenium film 50 is supported at its lower portions by the silicon nitride films 20 and 25 and the contact plug 24, which have a high adhesiveness to ruthenium. Therefore, the portions of the ruthenium film 50 that protrude from the silicon nitride film 25 do not collapse. Then, damage caused in the ruthenium film 50 is removed by a heat treatment.

Figure 36:
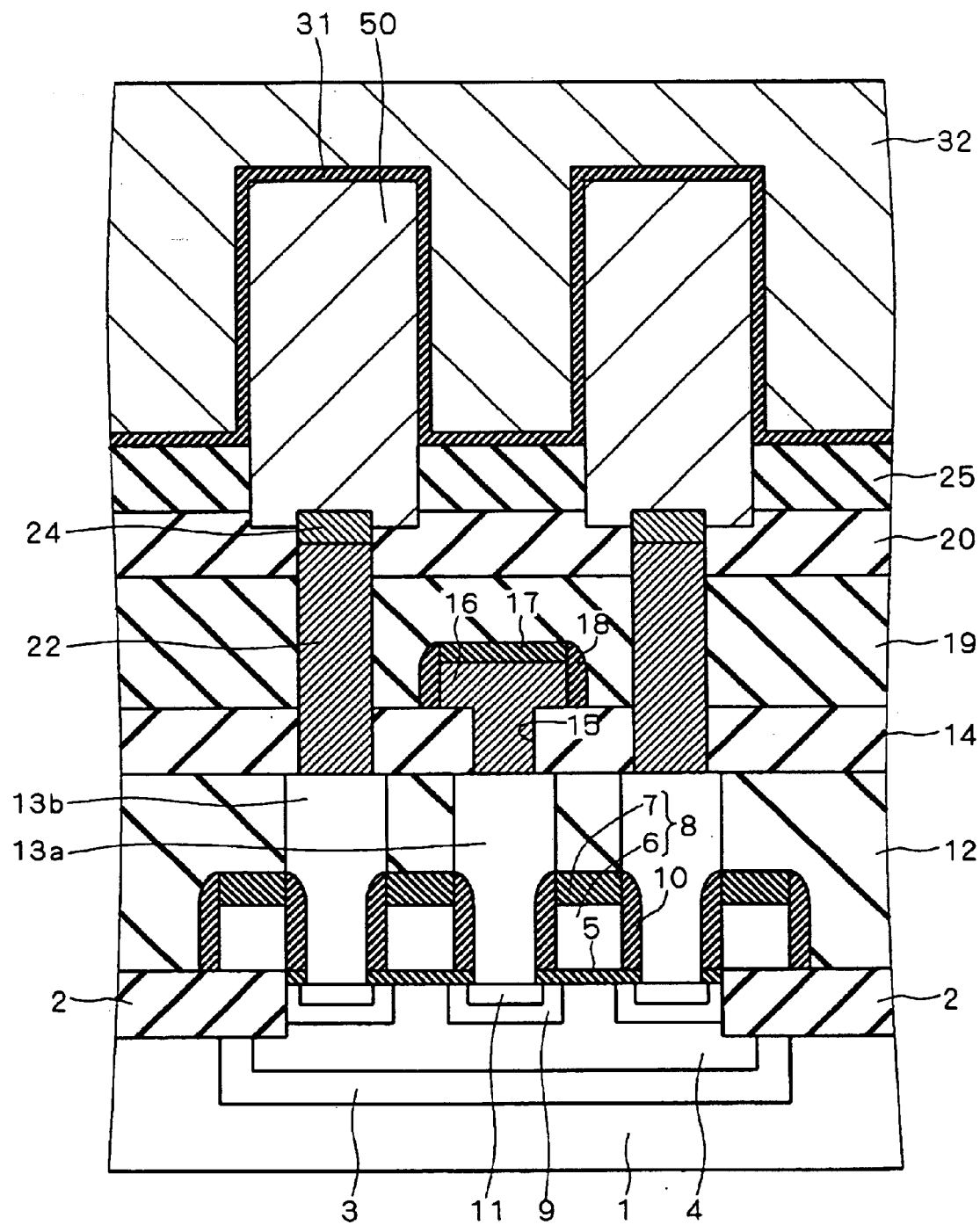
Figure 37:
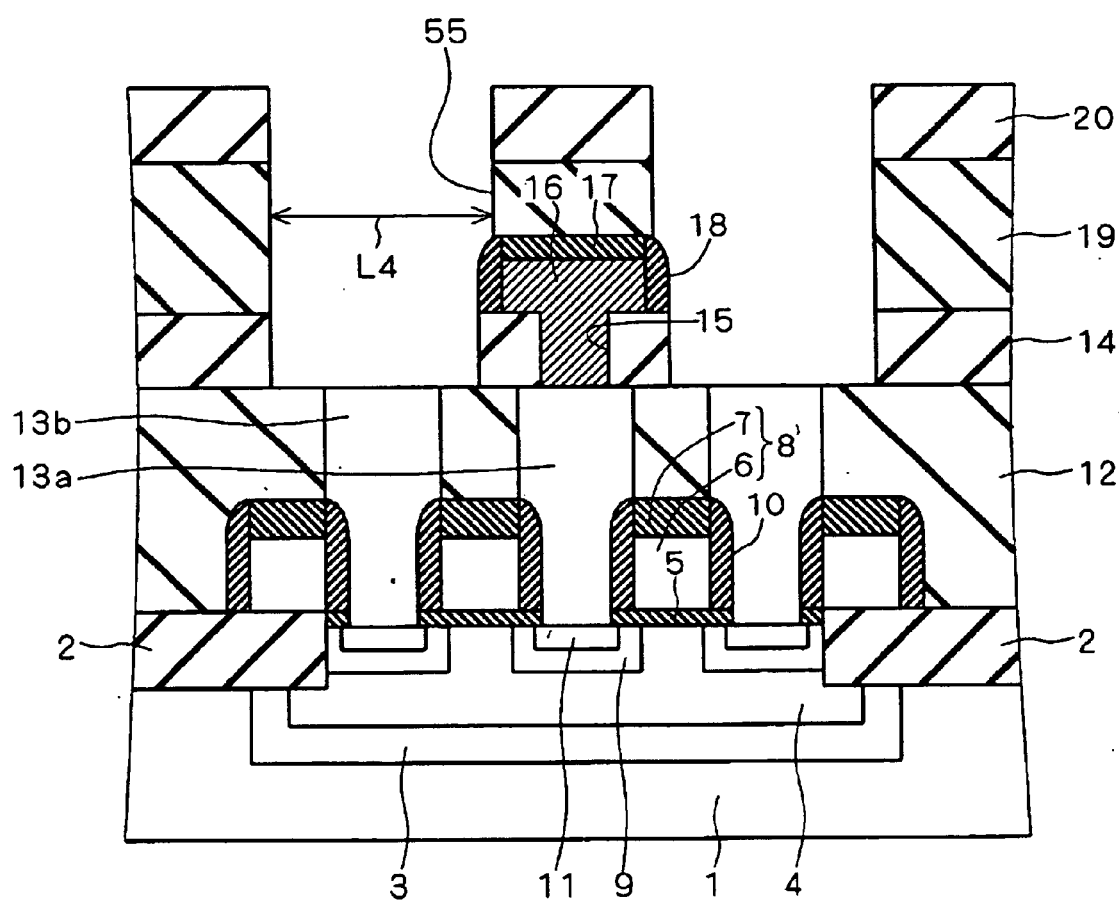
FIGS. 37 through 40 are cross-sectional views showing, in order of manufacturing steps, a method of manufacturing a capacitor according to a seventh preferred embodiment of the present invention.

Next, referring to FIG. 36, a tantalum oxide film 31 having a film thickness of about 0.5 to 2 nm is entirely formed on the ruthenium film 50 and the silicon nitride film 25, using a CVD technique. Subsequently, a heat treatment is performed in order to crystallize the tantalum oxide film 31 and to improve the film quality thereof. Then, using a sputtering technique or a CVD technique, a ruthenium film 32 having a film thickness of about 50 to 150 nm is entirely formed on the tantalum oxide film 31. With the process described above, a DRAM memory cell is completed that has an MOSFET and a capacitor connected thereto in series.

Thus, with the method of manufacturing a capacitor according to the sixth preferred embodiment, the areas in the capacitor lower electrode and the capacitor upper electrode that oppose each other are larger than those in the capacitor according to the foregoing first preferred embodiment. Therefore, it is possible to obtain a capacitor having a larger capacitance than the capacitor according to the foregoing first preferred embodiment.

It should be noted that the above description illustrates an example in which the invention according to this sixth preferred embodiment is applied to the method of manufacturing a capacitor according to the foregoing first preferred embodiment, but the invention according to the sixth preferred embodiment may be applied to any of the foregoing second to fourth preferred embodiments as well as the later-described seventh preferred embodiment.

Seventh Preferred Embodiment

FIGS. 37 through 40 are cross-sectional views showing, in order of manufacturing steps, a method of manufacturing a capacitor according to a seventh preferred embodiment of the present invention. First, a structure shown in FIG. 6 is obtained through the manufacturing steps similar to those in the first preferred embodiment. Next, referring to FIG. 37, the silicon nitride film 20 is patterned using a photolithography technique and an anisotropic dry etching technique. The silicon nitride film 20 has a pattern such that its portions that are above the contact plugs 13b are opened.

Next, using the silicon nitride film 20 as a bard mask, the silicon oxide film 19 is partially removed by an anisotropic dry etching technique. At this time, the etching is, performed under the condition that the etching rate for silicon oxide is sufficiently greater than the etching rate for silicon nitride. This forms contact holes 55 each having a bottom surface that is defined by the contact plug 13b and the silicon oxide film 12, and having a side surface that is defined by the silicon oxide films 14 and 19 and the sidewall spacer 18, in a self-aligned manner.

Figure 38:
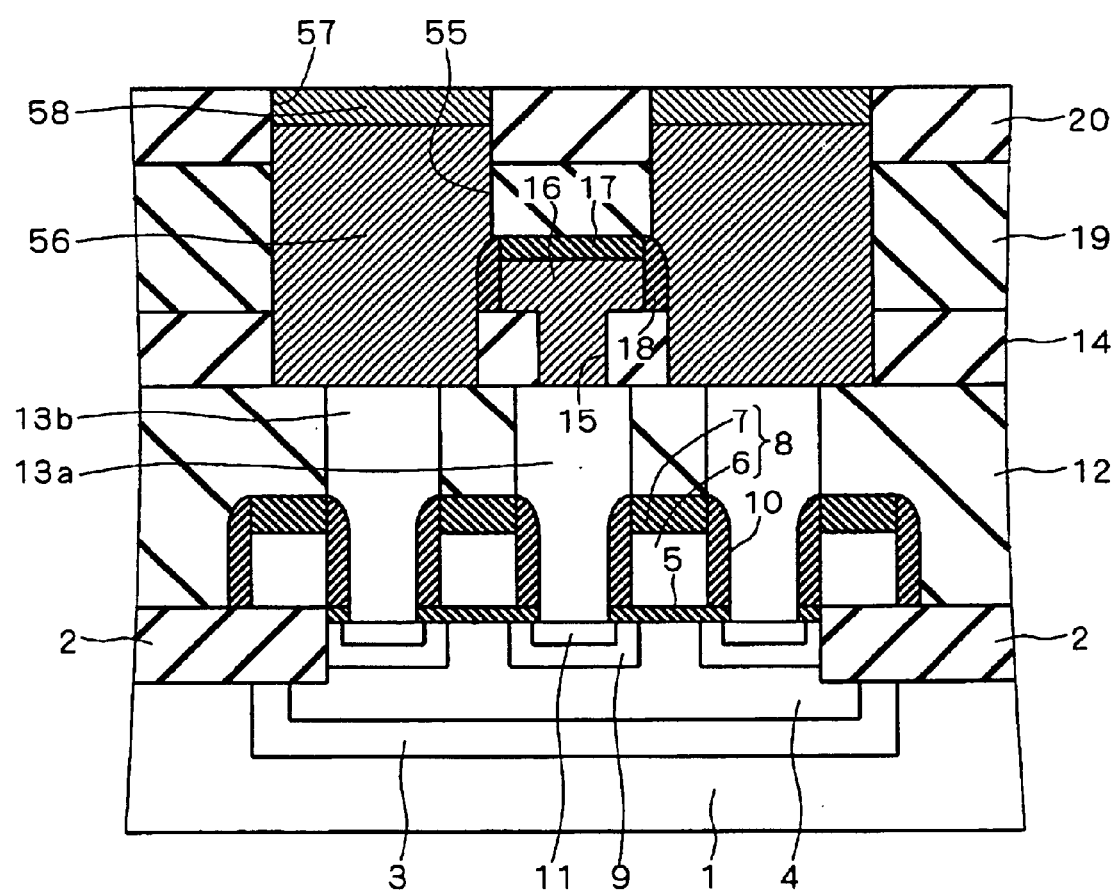

Next, referring to FIG. 38, a tungsten film having a thickness such that it can completely fill up the contact holes 55 is entirely formed in the contact holes 55 and on the silicon nitride film 20. Subsequently, a portion of the tungsten film that is present beyond the upper surface level of the silicon nitride film 20 is removed by an etch-back technique. In addition, portions of the tungsten film that are present in upper areas of the contact holes 55 are removed by an etch-back technique, thereby forming recesses 57. With the process described above, contact plugs 56 connected to the contact plugs 13b are formed.

Then, a barrier metal film (not shown) is entirely formed on the contact plugs 56 and the silicon nitride film 20. Subsequently, a tantalum nitride film having a film thickness such that it can completely fill up the recesses 57 is entirely formed on the barrier metal. Thereafter, portions of the tantalum nitride film and the barrier metal film that are present beyond the upper surface of the silicon nitride film 20 are removed by a CMP technique or an etch-back technique. This forms contact plugs 58 that fill up the recesses 57.

Figure 39:
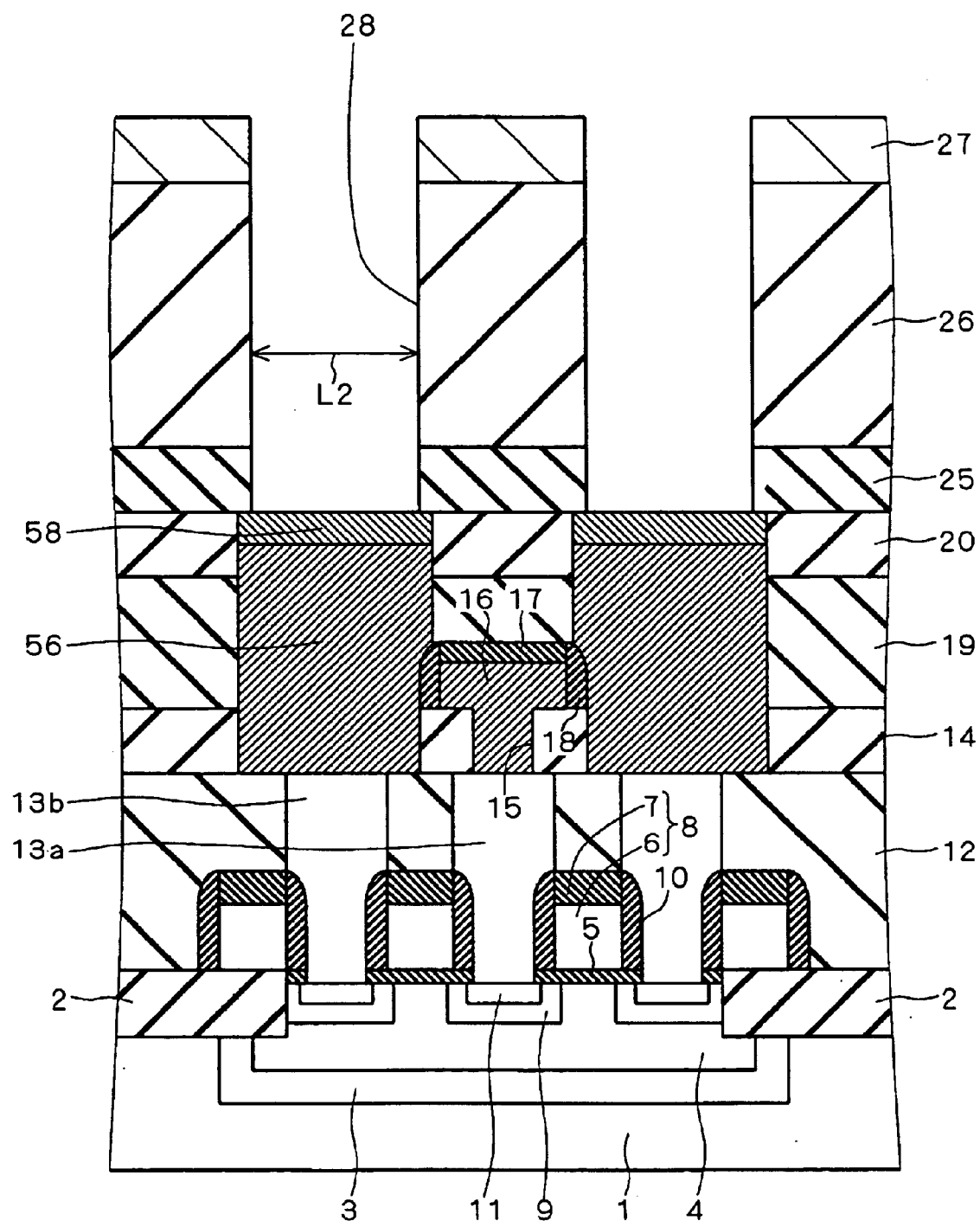
Figure 40:
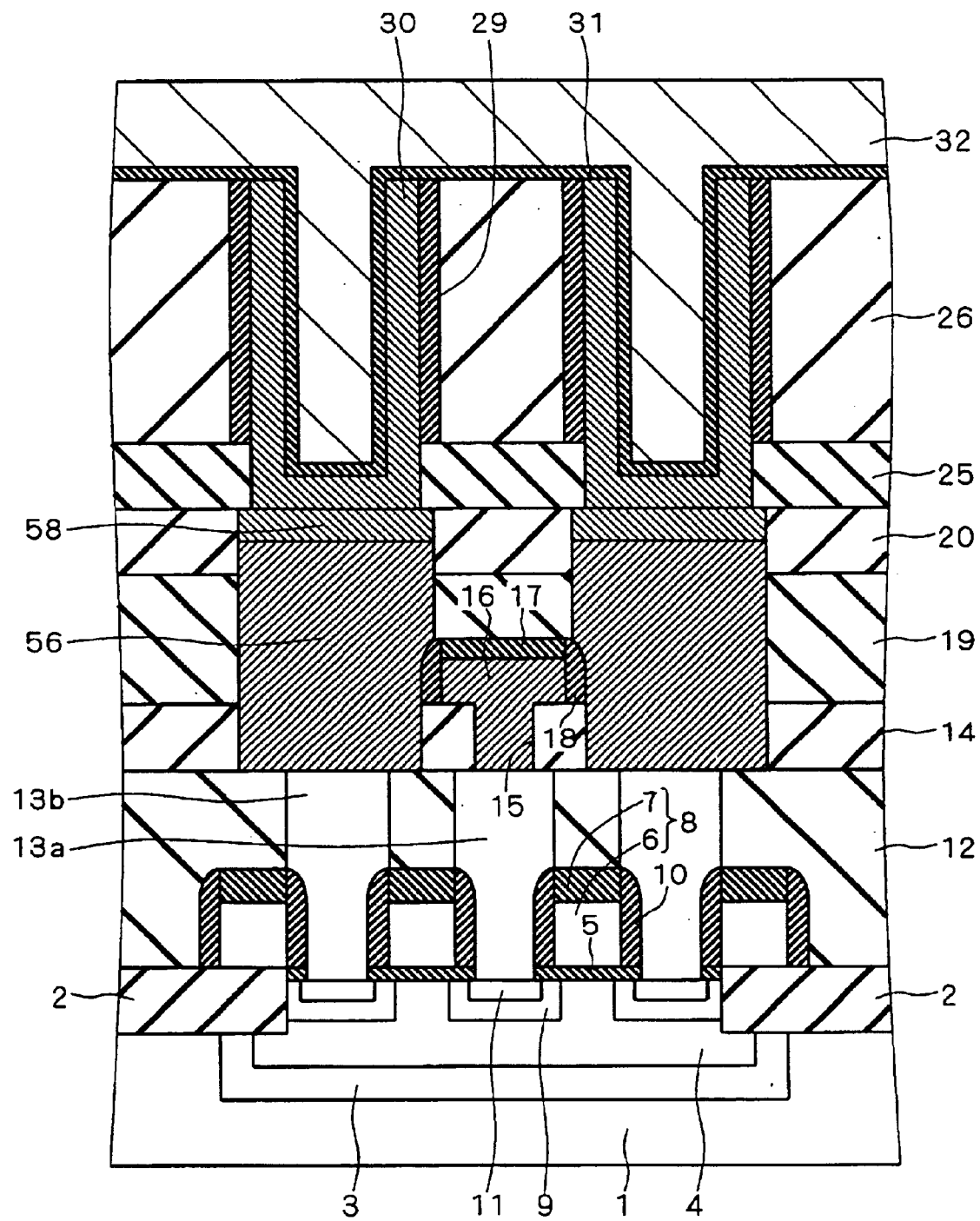

Next, referring to FIG. 39, a silicon nitride film 25 is entirely formed on the silicon nitride film 20 and the contact plugs 58 in a similar manner to that in the first preferred embodiment. Then, a silicon oxide film 26 is entirely formed on the silicon nitride film 25. Thereafter, a tungsten film 27 having a pattern such that its portions thereof that are above the contact plugs 58 are opened is formed on the silicon oxide film 26. Subsequently, using the tungsten film 27 as a metal hard mask and using the contact plugs 58 as an etch stopper, the silicon oxide film 26 and the silicon nitride film 25 are partially removed by an anisotropic dry etching technique. This forms through holes 28 each having a bottom surface that is defined by the contact plug 58, and having a side surface that is defined by the silicon oxide film 26 and the silicon nitride film 25. In this seventh preferred embodiment, the diameter L2 of the through holes 28 is smaller than he diameter L4 of the contact holes 55 shown in FIG. 37. Next, referring to FIG. 40, a modified layer 29, a ruthenium film 30, a tantalum oxide film 31, and a ruthenium film 32 are formed in this order in a similar manner to at in the foregoing first preferred embodiment. With the process described above, a RAM memory cell is completed that has an MOSFET and a capacitor connected thereto series.

Thus, in the method of manufacturing a capacitor according to the seventh preferred embodiment, the diameter L4 of the contact holes 55 is larger than the diameter L2 of the through holes 28. For this reason, in the photolithography process for patterning the tungsten film 27, margin for misalignment of the photomask can be made large. As a consequence, the ruthenium film 30 can reliably be brought into contact with the contact plugs 58.

Moreover, in the etching process for forming the through holes 28, the contact plugs 58 can be used as an etch stopper. This makes it easy to control the etching.

It should be noted that the above description illustrates an example in which the invention according to this seventh preferred embodiment is applied to the method of manufacturing a capacitor according to the foregoing first preferred embodiment, but the invention according to the seventh preferred embodiment may be applied to any of the foregoing second to sixth preferred embodiments. For example, when the invention according to the seventh preferred embodiment is applied to the foregoing second preferred embodiment, the diameter L4 of the contact holes 55 is made larger than the diameter L3 of the through holes 35. Likewise, when the invention according to the seventh preferred embodiment is applied to the foregoing third and fourth preferred embodiments, the diameter LA of the contact holes 55 is made larger than the diameter L3 of the contact holes 40 and 40a.

The foregoing first through the seventh preferred embodiments have described examples in which the capacitor upper electrodes and the capacitor lower electrodes are made of ruthenium, but the material of these electrodes may be other platinum group elements such as platinum (Pt) and iridium (Ir), or may be TiN. Further, the foregoing embodiments have described the cases where the capacitor dielectric film is made of tantalum oxide, but the material of the capacitor dielectric film may be other high-dielectric materials or ferroelectric materials, such as strontium titanate (STO) and barium strontium titanate (BST).

While the invention has been shown and described in detail, the foregoing description is in all aspects illustrative and not restrictive. It is therefore understood that numerous other modifications and variations can be devised without departing from the scope of the invention.

What is claimed is:

1. A method of manufacturing a semiconductor device having a capacitor, the method comprising the steps of:
   (a) forming, on a first insulating film formed on a semiconductor substrate, a second insulating film;
   (b) forming, in said first and second insulating films, a contact plug having an upper surface exposed in an upper surface of said second insulating film;
   (c) forming third and fourth insulating films on a structure obtained by said step (b) in this order;
   (d) forming a recess having a side surface and a bottom surface, said side surface defined by said third and fourth insulating films and said bottom surface defined by said upper surface of said second insulating film and said upper surface of said contact plug;
   (e) forming a capacitor lower electrode on said side surface and said bottom surface of said recess; and
   (f) forming a capacitor upper electrode over said capacitor lower electrode so that a capacitor dielectric film is interposed therebetween;
   wherein said second and third insulating films are made of a material having a higher adhesiveness to a material of which said capacitor lower electrode is made than a material of which said first and fourth insulating films are made.

2. The method according to claim 1, wherein, in said step (e), said capacitor lower electrode is formed directly on said side surface and said bottom surface of said recess.

3. The method according to claim 1, wherein:
   in said step (e), said capacitor lower electrode is formed so as to have a tubular shape an upper surface of which is opened; and
   further comprising the step of (g) removing said third and fourth insulating films, said step (g) being executed after said step (e) and before said step (f).

4. The method according to claim 1, wherein:
   in said step (e), said capacitor lower electrode filling said recess is formed; and
   further comprising the step of (g) removing said third and fourth insulating films, said step (g) being executed after said step (e) and before said step (f).

5. The method according to claim 1, wherein:
   in said step (b), said contact plug having a predetermined diameter is formed; and
   in said step (d), said recess is formed so that said bottom surface thereof has a diameter smaller than said predetermined diameter.

6. A method of manufacturing a semiconductor device having a capacitor, the method comprising the steps of:
   (a) forming a contact plug in a first insulating film formed on a semiconductor substrate, said contact plug having an upper surface exposed in an upper surface of said first insulating film;
   (b) forming a second insulating film on a structure obtained by said step (a);
   (c) partially forming a predetermined film on an upper surface of said second insulating film;
   (d) forming a recess by etching said second insulating film using said predetermined film as an etching mask, said recess having a side surface defined by said second insulating film and a bottom surface-defined by said upper surface of said first insulating film and said upper surface of said contact plug;
   (e) forming a conductive film on said side surface and said bottom surface of said recess and on said predetermined film;

(f) forming a capacitor lower electrode by removing said predetermined film and a portion of said conductive film that is present beyond an upper surface level of said second insulating film, said capacitor lower electrode formed of a remaining portion of said conductive film that has not removed; and (g) forming a capacitor upper electrode over said capacitor lower electrode so that a capacitor dielectric film is interposed therebetween;

wherein said predetermined material is made of a material having a higher adhesiveness to a material of said capacitor lower electrode is made than a material of which said second insulating film is made.

7. The method according to claim 6, wherein, in said step (e), said conductive film is directly formed on said side surface and said bottom surface of said recess and on said predetermined film.

8. The method according to claim 6, wherein:

in said step (f), said capacitor lower electrode is formed so as to have a tubular shape an upper surface of which is opened; and further comprising the step of (h) removing said second insulating film, said step (h) being executed after said step (f) and before said step (g).

9. The method according to claim 6, wherein:

in said step (f), said capacitor lower electrode filling said recess is formed; and further comprising the step of (h) removing said second insulating film, said step (h) being executed after said step (f) and before said step (g).

10. The method according to claim 6, wherein:

in said step (a), said contact plug having a predetermined diameter is formed; and in said step (d), said recess is formed so that said bottom surface thereof has a diameter smaller than said predetermined diameter.

11. A method of manufacturing a semiconductor device having a capacitor, the method comprising the steps of:

(a) forming a contact plug in a first insulating film formed on a semiconductor substrate, said contact plug having an upper surface exposed in an upper surface of said first insulating film;

(b) forming second and third insulating films on a structure obtained by said step (a) in this order, (c) forming a recess by etching said second and third insulating films under a condition that an etching rate for a material of which said second insulating film is made is higher than an etching rate for a material of which said third insulating film is made, said recess having a first side surface defined by said third insulating film, a second side surface defined by said second insulating film and receding from said first side surface, and a bottom surface defined by said upper surface of said first insulating film and said upper surface of said contact plug;

(d) forming a capacitor lower electrode on said first side surface, said second side surface, and said bottom surface of said recess; and (e) forming a capacitor upper electrode over said capacitor lower electrode so that a capacitor dielectric film is interposed therebetween.

12. The method according to claim 11, wherein, in said step (d), said capacitor lower electrode is formed directly on said first side surface, said second side surface, and said bottom surface of said recess.

13. The method according to claim 11, wherein:

in said step (d), said capacitor lower electrode is formed so as to have a tubular shape an upper surface of which is opened; and further comprising the step of (f) removing said third insulating film, said step (f) being executed after said step (d) and before said step (e).

14. The method according to claim 11, wherein:

in said step (d), said capacitor lower electrode filling said recess is formed; and further comprising the step of (f) removing said third insulating film, said step (f) being executed after said step (d) and before said step (e).

15. The method according to claim 11, wherein:

in said step (a), said contact plug having a predetermined diameter is formed; and in said step (c), said recess is formed so that said bottom surface thereof has a diameter smaller than said predetermined diameter.

* * * * *